(12) United States Patent
Fujimoto

(10) Patent No.: US 11,038,020 B2
(45) Date of Patent: Jun. 15, 2021

(54) SILICON CARBIDE SEMICONDUCTOR DEVICE AND METHOD OF MANUFACTURING A SILICON CARBIDE SEMICONDUCTOR DEVICE

(71) Applicant: FUJI ELECTRIC CO., LTD., Kawasaki (JP)

(72) Inventor: Takumi Fujimoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 85 days.

(21) Appl. No.: 16/139,714

(22) Filed: Sep. 24, 2018

(65) Prior Publication Data

US 2019/0165102 A1    May 30, 2019

(30) Foreign Application Priority Data

Nov. 28, 2017  (JP) .............................. JP2017-228293

(51) Int. Cl.
  *H01L 29/08*  (2006.01)
  *H01L 29/78*  (2006.01)
  (Continued)

(52) U.S. Cl.
  CPC ........ *H01L 29/0878* (2013.01); *H01L 21/046* (2013.01); *H01L 29/0821* (2013.01);
  (Continued)

(58) Field of Classification Search
  CPC ............. H01L 29/0878; H01L 29/7813; H01L 29/7397; H01L 29/1608; H01L 29/36; H01L 29/365
  See application file for complete search history.

(56) References Cited

U.S. PATENT DOCUMENTS

2006/0011128 A1   1/2006  Ellison et al.
2013/0075783 A1*  3/2013  Yamazaki ............. H01L 21/263
                                                257/139
(Continued)

FOREIGN PATENT DOCUMENTS

JP            4939777 B2     5/2012

OTHER PUBLICATIONS

Rupendra Kumar Sharma et al., "Simulation and Characterization of 4H-SiC JBS Diodes Irradiated by Hydrogen and Carbon Ions", International Journal of Microelectronics and Computer Science, vol. 6, No. 2, 2015, pp. 59-63.
(Continued)

*Primary Examiner* — Shih Tsun A Chou

(57) ABSTRACT

A silicon carbide semiconductor device includes a semiconductor substrate and a first semiconductor layer of the first conductivity type; a second semiconductor layer of a second conductivity type; a first semiconductor region of the first conductivity type; a gate electrode provided opposing at least a surface of the second semiconductor layer between the first semiconductor region and the first semiconductor layer, across a gate insulating film; and a first electrode provided on surfaces of the first semiconductor region and the second semiconductor layer. Protons are implanted in a first region of the semiconductor substrate, spanning at least 2 μm from a surface of the semiconductor substrate facing toward the first semiconductor layer; and in a second region of the first semiconductor layer, spanning at least 3 μm from a surface of the first semiconductor layer facing toward the semiconductor substrate. The protons having a concentration in a range from $1\times10^{13}/cm^3$ to $1\times10^{15}/cm^3$.

8 Claims, 26 Drawing Sheets

(51) Int. Cl.
  *H01L 29/16*   (2006.01)
  *H01L 29/66*   (2006.01)
  *H01L 29/739*  (2006.01)
  *H01L 21/04*   (2006.01)

(52) U.S. Cl.
  CPC .... *H01L 29/1608* (2013.01); *H01L 29/66068* (2013.01); *H01L 29/7397* (2013.01); *H01L 29/7805* (2013.01); *H01L 29/7813* (2013.01)

(56) References Cited

U.S. PATENT DOCUMENTS

| 2014/0299915 | A1* | 10/2014 | Kouno | H01L 29/1095 257/139 |
| 2016/0260809 | A1* | 9/2016 | Hirler | H01L 29/7803 |
| 2017/0012102 | A1 | 1/2017 | Konrath et al. | |

OTHER PUBLICATIONS

Zhiyun Luo et al., "Proton Radiation Effects in 4H-SiC Diodes and MOS Capacitors", IEEE Transactions on Nuclear Science, vol. 51, No. 6, Dec. 2004. pp. 3748-3752.

A Castaldini et al., "Assessment of the intrinsic nature of deep level Z1/Z2 by compensation effects in proton-irradiated 4H-SiC", Published Apr. 6, 2006, 2006 IOP Publishing Ltd., Semiconductor Science and Technology, vol. 21, No. 6, pp. 724-728.

* cited by examiner

SILICON CARBIDE SEMICONDUCTOR DEVICE AND METHOD OF MANUFACTURING A SILICON CARBIDE SEMICONDUCTOR DEVICE

CROSS REFERENCE TO RELATED APPLICATIONS

This application is based upon and claims the benefit of priority of the prior Japanese Patent Application No. 2017-228293, filed on Nov. 28, 2017, the entire contents of which are incorporated herein by reference.

BACKGROUND

1. Field

Embodiments of the invention relate to a silicon carbide semiconductor device and a method of manufacturing a silicon carbide semiconductor device.

2. Description of Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable material, has a wide bandgap of 3 eV, and can be used very stably as a semiconductor material even at high temperatures. Further, silicon carbide has a critical electric field strength that is ten times that of silicon or greater, and has a high possibility of exceeding the material limit of silicon. Therefore, future growth is strongly expected for power semiconductor applications, particularly MOSFETs.

A structure of a conventional silicon carbide semiconductor device will be described taking a vertical MOSFET having a trench structure as an example. FIG. 30 is a cross-sectional view of a structure of the conventional silicon carbide semiconductor device. As depicted in FIG. 30, a high-concentration n-type epitaxial layer 102 is deposited on a front surface of an n$^+$-type silicon carbide semiconductor substrate 101, and an n$^-$-type drift layer 103 is deposited on a surface of the high-concentration n-type epitaxial layer 102. In a surface of the n$^-$-type drift layer 103, a p$^+$-type base region 104 is selectively provided.

A trench structure is formed in the silicon carbide semiconductor device, at a side of the silicon carbide semiconductor device having the p$^+$-type base region 104. In particular, a trench 115 penetrates the p$^+$-type base region 104 from a first surface of the p$^+$-type base region 104, opposite a second surface of the p$^+$-type base region 104 facing toward the n$^+$-type silicon carbide semiconductor substrate 101. The trench 115 reaches the n$^-$-type drift layer 103. Along an inner wall of the trench 115, a gate insulating film 105 is formed at a bottom and side walls of the trench 115. On the gate insulating film 105 in the trench 115, a gate electrode 106 is formed. Further, an n$^+$-type source region 108 and a p$^+$-type contact region 107 are selectively formed in the surface of the p$^+$-type base region 104.

Here, FIG. 31 is a graph of impurity concentrations of the conventional silicon carbide semiconductor device. FIG. 31 depicts impurity concentrations along line A-A1 in FIG. 30. In FIG. 31, a vertical axis indicates depth from the surface of the p$^+$-type contact region 107 and a horizontal axis indicates impurity concentration. Further, a dotted line parallel to the horizontal axis indicates an interface of the n$^+$-type silicon carbide semiconductor substrate 101 and the high-concentration n-type epitaxial layer 102. As depicted in FIG. 31, the impurity concentration of the p$^+$-type contact region 107 is higher than an impurity concentration of the p$^+$-type base region 104; and the impurity concentrations increase sequentially in the order of the n$^-$-type drift layer 103, the high-concentration n-type epitaxial layer 102 and the n$^+$-type silicon carbide semiconductor substrate 101.

Further, an interlayer insulating film 109 is provided so as to cover the gate electrode 106 embedded in the trench 115. A source electrode 110 is in contact with the n$^+$-type source region 108 and the p$^+$-type contact region 107, via a contact hole opened in the interlayer insulating film 109. At a rear surface of the n$^+$-type silicon carbide semiconductor substrate 101, a drain electrode (not depicted) is provided.

The vertical MOSFET having such a structure, a parasitic pn diode formed by the p$^+$-type base region 104 and the n$^-$-type drift layer 103 is built-in as a body diode between the source and drain. The parasitic pn diode may be operated by an application of a high electric potential to the source electrode 110 and current flows in a direction (direction indicated by arrow B in FIG. 30) from the p$^+$-type contact region 107, through the p$^+$-type base region 104, the n$^-$-type drift layer 103 and the high-concentration n-type epitaxial layer 102, to the n$^+$-type silicon carbide semiconductor substrate 101. In this manner, at the MOSFET, a parasitic pn diode different from the IGBT is built-in, whereby a free wheeling diode (FWD) used in an inverter may be omitted, contributing to reductions in cost and size. Hereinafter, the parasitic pn diode of the MOSFET will be indicated as "built-in diode".

FIG. 32 is a graph of hole density of the conventional silicon carbide semiconductor device. Further, FIG. 33 is a graph of electron density of the conventional silicon carbide semiconductor device. FIGS. 32 and 33 depict the hole density and the electron density of a part along line A-A' in FIG. 30. A vertical axis indicates depth from a surface of the p$^+$-type contact region 107 and a horizontal axis indicates both hole density and electron density. Further, a dotted line parallel to the horizontal axis indicates the interface of the n$^+$-type silicon carbide semiconductor substrate 101 and the high-concentration n-type epitaxial layer 102.

As depicted in FIGS. 32 and 33, holes are present in the p$^+$-type contact region 107 and electrons are present in the n$^+$-type silicon carbide semiconductor substrate 101 and the high-concentration n-type epitaxial layer 102. Therefore, when current flows through the built-in diode, holes are implanted from the p$^+$-type contact region 107 and, electron and hole recombination occurs in the n$^-$-type drift layer 103 or the n$^+$-type silicon carbide semiconductor substrate 101. At this time, if crystal defects of the n$^+$-type silicon carbide semiconductor substrate 101 are present, due to generated recombination energy (3 eV) equivalent to the bandgap, basal plane dislocations, which are one type of crystal defect present in the n$^+$-type silicon carbide semiconductor substrate 101 migrate, and stacking defects sandwiched between two basal plane dislocations expand. Here, FIG. 34 is a cross-sectional view of a stacking defect in the conventional silicon carbide semiconductor device. FIG. 35 is a top view of the stacking defect in the conventional silicon carbide semiconductor device. FIG. 34 depicts an example in which a basal plane dislocation 111 grows into a stacking defect 112. FIG. 35 is an example of a photo luminescence (PL) image of an element in which a stacking defect occurs after current is applied. It is found that a triangular stacking defect 113 and a bar stacking defect 114 occur.

When a stacking defect expands, the stacking defect inhibits the flow of current, whereby the ON resistance of the MOSFET and forward voltage of the built-in diode increase. When such operation continues, the stacking defect cumulatively expands, whereby loss that occurs in the inverter circuit increases over time and the amount of heat generated increases, causing device failure. To prevent this problem, a Schottky Barrier Diode (SiC-SBD) may be connected in antiparallel to the MOSFET and current is prevented from flowing in the built-in diode of the MOSFET.

Further, as depicted in FIG. 30, the high-concentration n-type epitaxial layer 102 is provided, whereby the stacking defect may be prevented from growing. By forming such a highly dope layer, lifetime killers are introduced, holes from the n$^-$-type drift layer 103 are captured, and the occurrence of stacking defects as well as increases in the mathematic area thereof are suppressed.

Further, there is a technique of reducing minority carriers within a boundary layer where at the time of epitaxial growth or after epitaxial growth, by using any one of transition metal doping, or an externally generated specific defect or a specific internal growth defect by an electron or a proton irradiation technique and introducing a lifetime killer (for example, refer to Japanese Patent No. 4939777). Further, there is a technique of forming a crystal defect by implanting at least, helium (He), noble gas, platinum (Pt), vanadium (V), group 4 ions, etc. into a silicon carbide semiconductor substrate (for example, refer to U.S. Patent Application Publication No. 2017/0012102).

SUMMARY

According to an embodiment, a silicon carbide semiconductor device includes a semiconductor substrate of a first conductivity type; a first semiconductor layer of the first conductivity type provided on the semiconductor substrate, the first semiconductor layer having an impurity concentration that is lower than an impurity concentration of the semiconductor substrate; a second semiconductor layer of a second conductivity type provided on a first side of the first semiconductor layer, opposite a second side of the first semiconductor layer facing toward the semiconductor substrate; a first semiconductor region of the first conductivity type selectively provided in a surface layer of the second semiconductor layer, the first semiconductor region having an impurity concentration that is higher than the impurity concentration of the semiconductor substrate, the surface layer being on a first side of the second semiconductor layer, opposite a second side of the second semiconductor layer facing toward the first semiconductor layer; a gate electrode provided opposing at least a part of a surface of the second semiconductor layer between the first semiconductor region and the first semiconductor layer, across a gate insulating film; and a first electrode provided on the surface of the second semiconductor layer and the first semiconductor region. Protons are implanted in a first region of the semiconductor substrate, the first region spanning least 2 μm from a surface of the semiconductor substrate facing toward the first semiconductor layer and a second region of the first semiconductor layer, the second region spanning at least 3 μm from a surface of the first semiconductor layer on the second side of the first semiconductor layer facing toward the semiconductor substrate, a concentration of the protons being in a range from $1\times10^{13}/cm^3$ to $1\times10^{15}/cm^3$.

In the embodiment, the protons are implanted in a region of the first semiconductor layer other than the second region at a concentration of less than $1\times10^{13}/cm^3$.

In the embodiment, the protons are implanted in the gate insulating film.

In the embodiment, helium is implanted in place of the protons.

According to another embodiment, a silicon carbide semiconductor device includes a semiconductor substrate of a second conductivity type; a first semiconductor layer of a first conductivity type provided on the semiconductor substrate; a second semiconductor layer of the second conductivity type provided on a first side of the first semiconductor layer, opposite a second side of the first semiconductor layer facing toward the semiconductor substrate; a first semiconductor region of the first conductivity type selectively provided in a surface layer of the second semiconductor layer on a first side of the second semiconductor layer, opposite a second side of the second semiconductor layer facing toward the first semiconductor layer, the first semiconductor region having an impurity concentration that is higher than an impurity concentration of the first semiconductor layer; and a gate electrode provided opposing at least a part of a surface of the second semiconductor layer between the first semiconductor region and the first semiconductor layer, across a gate insulating film. Protons are implanted in a first region of the semiconductor substrate, the first region spanning a predetermined distance from a surface of the semiconductor substrate facing toward the first semiconductor layer, the protons being implanted in a second region of the first semiconductor layer, the second region spanning a predetermined distance from a surface of the first semiconductor layer on the second side of the first semiconductor layer facing toward the semiconductor substrate, the protons being implanted in a third region of the first semiconductor layer, the third region spanning a predetermined distance from a surface of the first semiconductor layer on the first side of the first semiconductor layer facing toward the second semiconductor layer, and the protons being implanted in a fourth region of the second semiconductor layer, the fourth region spanning a predetermined distance from a surface of the second semiconductor layer on the second side of the second semiconductor layer facing toward the first semiconductor layer.

According to another embodiment, a method of manufacturing a silicon carbide semiconductor device, includes forming a first semiconductor layer of a first conductivity type on a semiconductor substrate of the first conductivity type, the first semiconductor layer having an impurity concentration lower than an impurity concentration of the semiconductor substrate; forming a second semiconductor layer of a second conductivity type on a first side of the first semiconductor layer, opposite a second side of the first semiconductor layer facing toward the semiconductor substrate; selectively forming a first semiconductor region of the first conductivity type in a surface layer of the second semiconductor layer on a first side of the second semiconductor layer, opposite a second side of the second semiconductor layer facing toward the first semiconductor layer, the first semiconductor region having an impurity concentration higher than an impurity concentration of the semiconductor substrate; forming a gate electrode opposing at least a part of a surface of the second semiconductor layer between the first semiconductor region and the first semiconductor layer, across the gate insulating film; irradiating protons in a first region of the semiconductor substrate, the first region spanning at least 2 μm from a surface of the semiconductor substrate facing toward the first semiconductor layer and irradiating protons in a second region of the first semiconductor layer, the second region spanning at least 3 μm from a surface of the first semiconductor layer on the second side of the first semiconductor layer facing toward the semiconductor substrate, a concentration of the protons being in a range from $1\times10^{13}/cm^3$ to $1\times10^{15}/cm^3$; and forming a first electrode on surfaces of the first semiconductor region and the second semiconductor layer.

In the embodiment, irradiating the protons includes irradiating the protons from a side of the semiconductor substrate facing toward the first electrode. The method further includes performing heat treatment at a temperature of 420 degrees C. or less after forming the first electrode.

In the embodiment, irradiating the protons includes irradiating the protons from a first side of the semiconductor substrate, opposite a second side of the semiconductor substrate facing toward the first electrode. The method further includes performing heat treatment at a temperature of 420 degrees C. or less after forming the first electrode.

Objects, features, and advantages of the present invention are specifically set forth in or will become apparent from the following detailed description of the invention when read in conjunction with the accompanying drawings.

DESCRIPTION OF EMBODIMENTS

Figure 1:
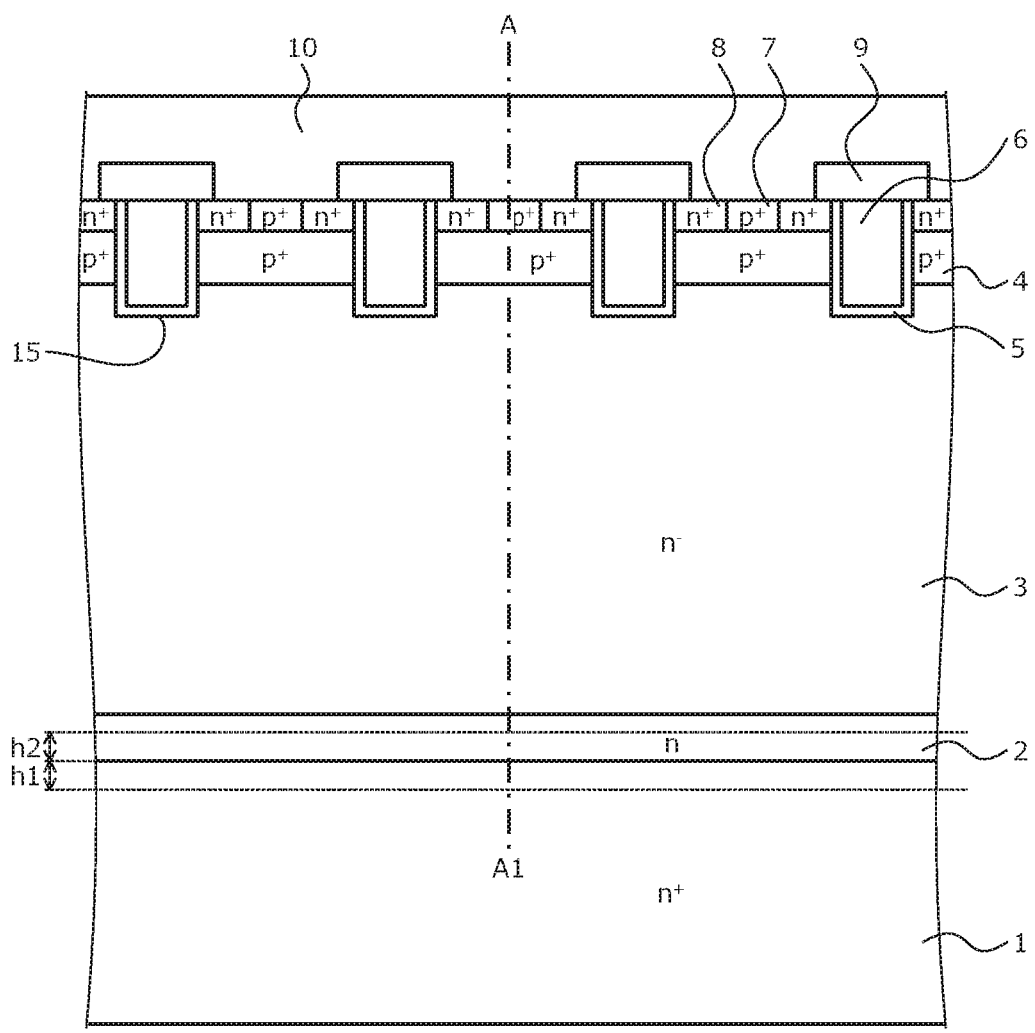
FIG. 1 is a cross-sectional view of a structure of a silicon carbide semiconductor device according to a first embodiment.

First, problems associated with the related arts will be described. The high-concentration n-type epitaxial layer 102, for example, has to have a film thickness 5 μm to 10 μm and an impurity concentration of $2 \times 10^{18}/cm^3$ or higher. Thus, a problem arises in that formation of the high-concentration n-type epitaxial layer 102 of this thickness leads to decreased throughput of epitaxial growth resulting in increased cost, increased defect density resulting in decreased yield and increased substrate resistance. A further problem arises in that due to the high-concentration n-type epitaxial layer 102, lifetime accuracy is dependent on concentration and film thickness and therefore, differs greatly.

Embodiments of a silicon carbide semiconductor device and method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

FIG. 1 is a cross-sectional view of a structure of the silicon carbide semiconductor device according to a first embodiment. In the first embodiment, a case in which the silicon carbide semiconductor device is a MOSFET will be described. As depicted in FIG. 1, in the silicon carbide semiconductor device according to the first embodiment, an n-type boundary layer 2 and an $n^−$-type drift layer (first semiconductor layer of a first conductivity type) 3 are deposited on a first main surface (front surface), for example, (0001) plane (Si face), of an $n^+$-type silicon carbide semiconductor substrate (semiconductor substrate of a first conductivity type) 1.

The $n^+$-type silicon carbide semiconductor substrate 1 is a silicon carbide single crystal substrate doped with, for example, nitrogen (N). The n-type boundary layer 2, for example, is doped with nitrogen and has an impurity concentration that is lower than that of the $n^+$-type silicon carbide semiconductor substrate 1. The n-type boundary layer 2 is provided so that crystal defects of the $n^+$-type silicon carbide semiconductor substrate 1 are propagated to the $n^−$-type drift layer 3. The $n^−$-type drift layer 3 is a low-concentration n-type drift layer that, for example, is doped with nitrogen and has an impurity concentration that is less than that of the $n^+$-type silicon carbide semiconductor substrate 1. Hereinafter, the $n^+$-type silicon carbide semiconductor substrate 1, the n-type boundary layer 2, the $n^−$-type drift layer 3, and a later-described $p^+$-type base region (second semiconductor layer of a second conductivity type) 4 combined constitute a silicon carbide semiconductor base.

At a second main surface (rear surface, i.e., rear surface of the silicon carbide semiconductor base) of the $n^+$-type silicon carbide semiconductor substrate 1, a rear electrode (not depicted) is provided. The rear electrode constitutes a drain electrode. At a surface of the rear electrode, a drain electrode pad (not depicted) is provided.

At a first main surface side ($p^+$-type base region 4 side) of the silicon carbide semiconductor base, the trench structure is formed. In particular, a trench 15 penetrates the $p^+$-type base region 4 from a surface of the $p^+$-type base region 4 on a first side (first main surface side of the silicon carbide semiconductor base) of the $p^+$-type base region 4, opposite a second side of the $p^+$-type base region 4 facing toward the $n^+$-type silicon carbide semiconductor substrate 1. The trench 15 reaches the $n^−$-type drift layer 3. Along an inner wall of the trench 15, a gate insulating film 5 is formed at side walls and a bottom of the trench 15. A gate electrode 6 is formed on the gate insulating film 5 in the trench 15. The gate electrode 6 is insulated from the $n^−$-type drift layer 3 and the $p^+$-type base region 4 by the gate insulating film 5. A part of the gate electrode 6 may protrude toward the source electrode 10, from a top (source electrode 10 side) of the trench 15.

At a base first main surface side of the $n^−$-type drift layer 3, the $p^+$-type base region 4 is provided. In the $p^+$-type base region 4, at the base first main surface side, an $n^+$-type source region (first semiconductor region of the first conductivity type) 8 and a $p^+$-type contact region 7 are selectively provided. The $n^+$-type source region 8 is in contact with the trench 15. Further, the $n^+$-type source region 8 and the $p^+$-type contact region 7 are in contact with each other.

In FIG. 1, while only four trench MOS structures are depicted, further MOS gate (insulated gate constituted by a metal oxide film semiconductor) structures having a trench structure may be disposed in parallel.

An interlayer insulating film 9 is provided at the first main surface side of the silicon carbide semiconductor base so as to cover the gate electrode 6 embedded in the trench 15. The source electrode 10 is in contact with the $n^+$-type source region 8 and the $p^+$-type contact region 7, via a contact hole opened in the interlayer insulating film 9. The source electrode 10 is electrically insulated from the gate electrode 6 by the interlayer insulating film 9. On the source electrode 10, a source electrode pad (not depicted) is provided. For example, a barrier metal (not depicted) that prevents metal atoms from diffusing from the source electrode 10 toward the gate electrode 6 may be provided between the source electrode 10 and the interlayer insulating film 9.

In the silicon carbide semiconductor device of the first embodiment, protons are implanted as a lifetime killer near an interface of the $n^+$-type silicon carbide semiconductor substrate 1 and the n-type boundary layer 2. The protons are lifetime killers and may reduce the hole density at the interface of the $n^+$-type silicon carbide semiconductor substrate 1 and the n-type boundary layer 2 by 100 times or more. As a result, hole and electron recombination may be reduced and the growth of crystal defects may be suppressed.

Figure 2:
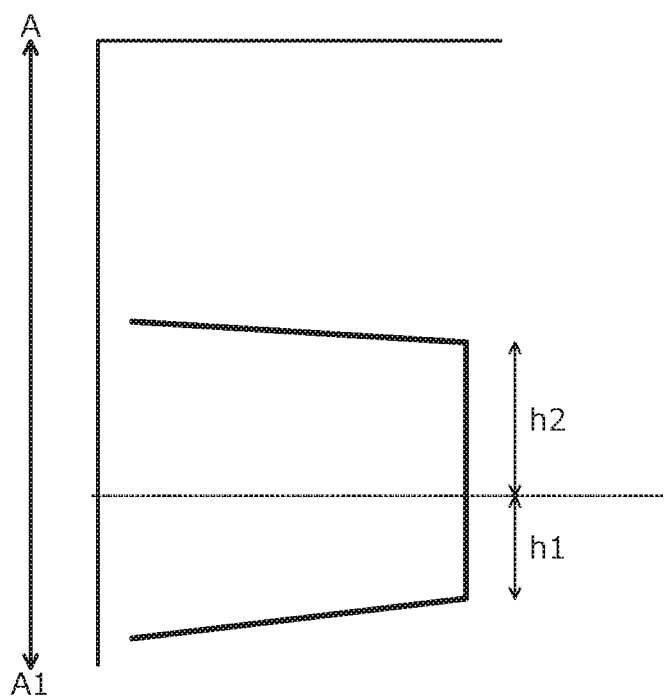
FIG. 2 is a graph of proton concentration of the silicon carbide semiconductor device according to the first embodiment.

FIG. 2 is a graph of proton concentration of the silicon carbide semiconductor device according to the first embodiment. FIG. 2 depicts proton concentration of a part along line A-A' in FIG. 1. In FIG. 2, a vertical axis indicates depth from the surface of the $p^+$-type contact region 7 and a horizontal axis indicates proton concentration. Further, a dotted line parallel to the horizontal axis indicates the interface of the n+-type silicon carbide semiconductor substrate 1 and the n-type boundary layer 2.

As depicted in FIGS. 1 and 2, protons are implanted, for example, into a region of the n+-type silicon carbide semiconductor substrate 1, the region spanning a distance h1 (for example, 2 μm) or greater from the surface of the n+-type silicon carbide semiconductor substrate 1 facing toward the n-type boundary layer 2, and protons are implanted in a region of the n-type boundary layer 2, said region spanning a distance h2 (for example, 3 μm) or greater from the surface of the n-type boundary layer 2 facing toward the n+-type silicon carbide semiconductor substrate 1. A concentration of the protons is in a range from $1\times10^{13}/cm^3$ to $1\times10^{15}/cm^3$. When the concentration is lower than $1\times10^{13}/cm^3$, function as the lifetime killer is insufficient and when the concentration is higher than $1\times10^{15}/cm^3$, current does not flow to the built-in diode.

For example, the concentration of protons is set to be $1\times10^{14}/cm^3$, whereby the hole density at the interface of the n+-type silicon carbide semiconductor substrate 1 and the n-type boundary layer 2 may be $1\times10^{15}/cm^3$ or less, and even when current density is 1500 A/cm², the occurrence of crystal defects may be prevented.

Figure 3:
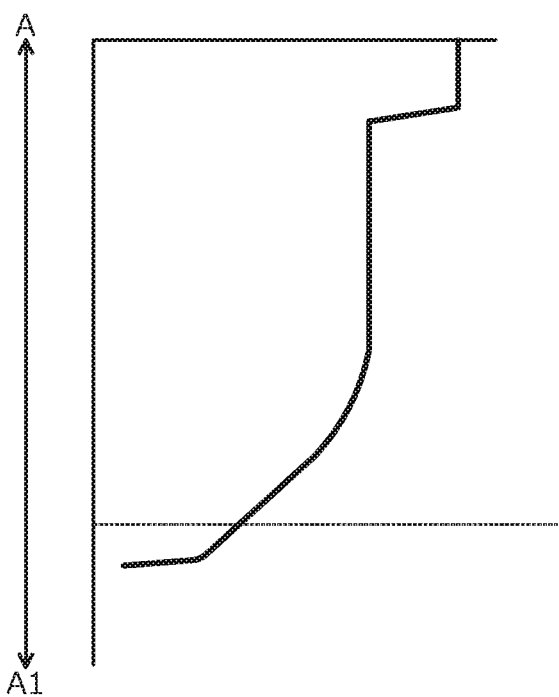
FIG. 3 is a graph of hole density of the silicon carbide semiconductor device according to the first embodiment.
Figure 32:
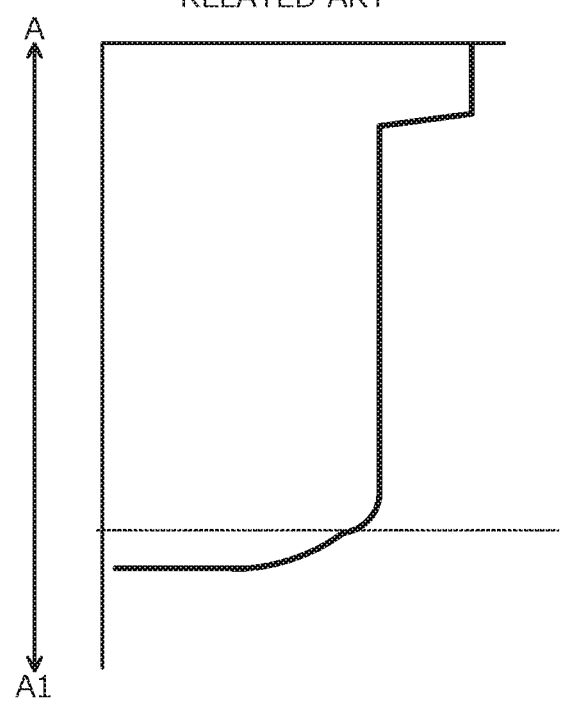
FIG. 32 is a graph of hole density of the conventional silicon carbide semiconductor device.
Figure 33:
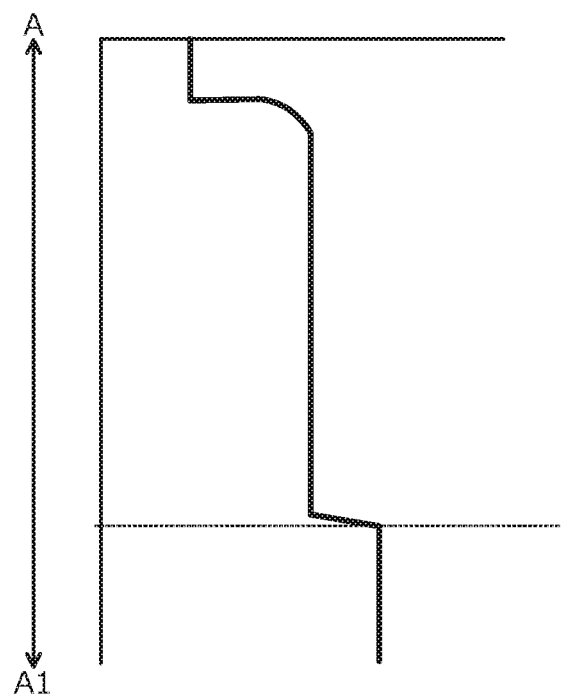
FIG. 33 is a graph of electron density of the conventional silicon carbide semiconductor device.
Figure 34:
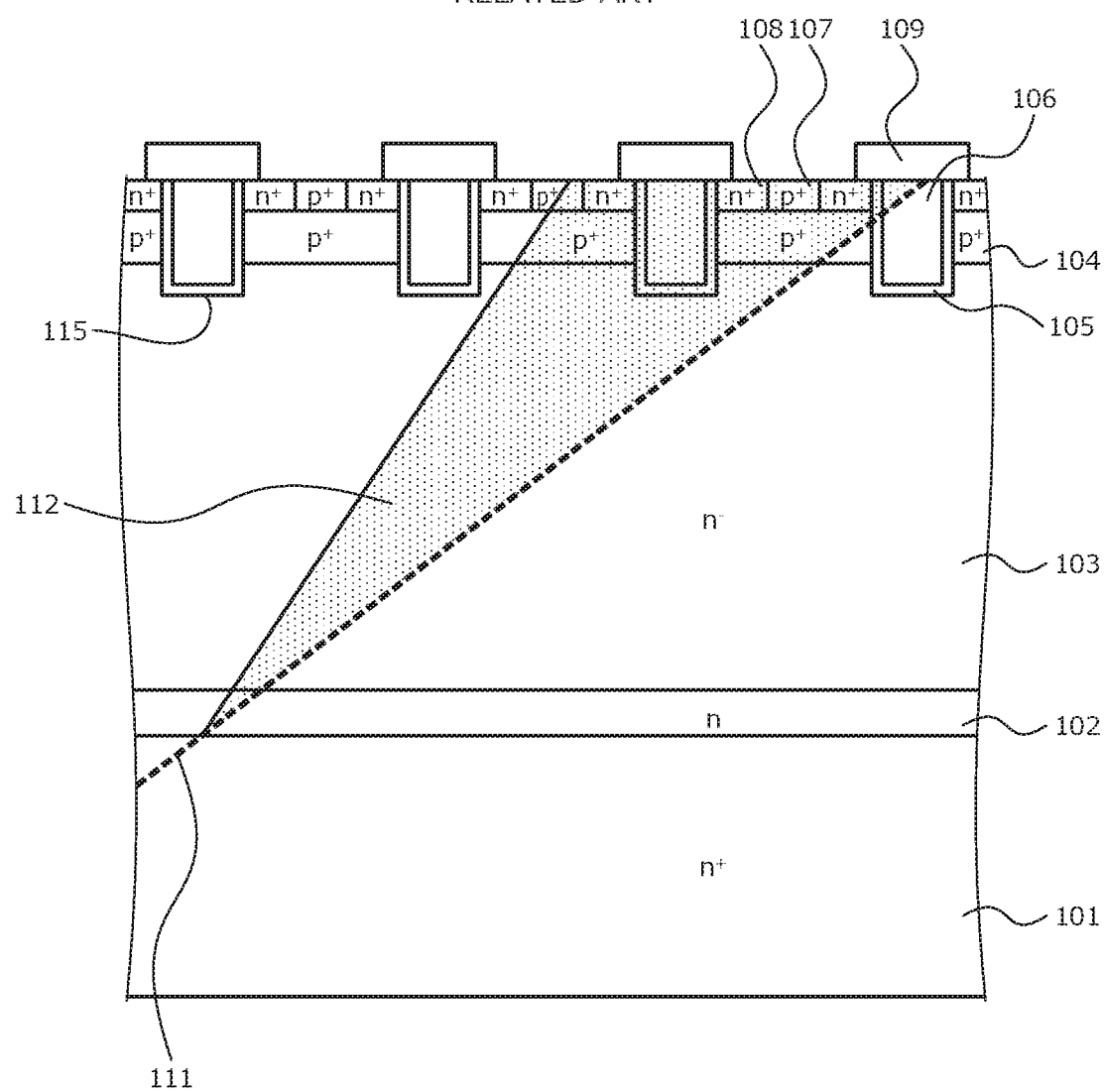
FIG. 34 is a cross-sectional view of a stacking defect in the conventional silicon carbide semiconductor device.
Figure 35:
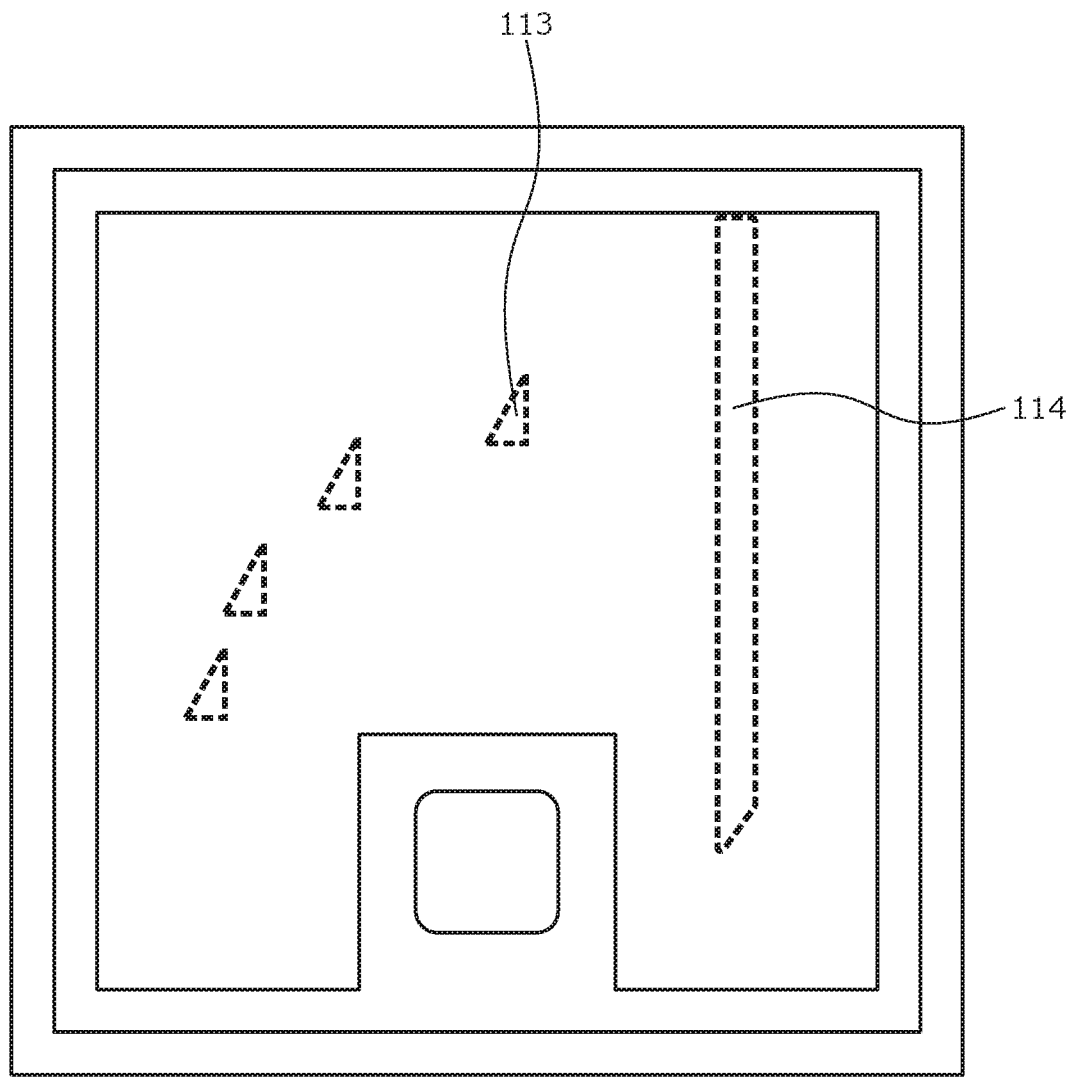
FIG. 35 is a top view of the stacking defect in the conventional silicon carbide semiconductor device.

Further, FIG. 3 is a graph of the hole density of the silicon carbide semiconductor device according to the first embodiment. FIG. 3 depicts hole density of a part along line A-A' in FIG. 1. In FIG. 3 a vertical axis indicates depth from a surface of the p+-type contact region 7 and a horizontal axis represents hole density. Further, a dotted line parallel to the horizontal axis indicates the interface of the n+-type silicon carbide semiconductor substrate 1 and the n-type boundary layer 2. As depicted in FIG. 3, compared to the conventional example (refer to FIG. 32), the hole density at the interface of the n+-type silicon carbide semiconductor substrate 1 and the n-type boundary layer 2 is decreased.

Figure 4:
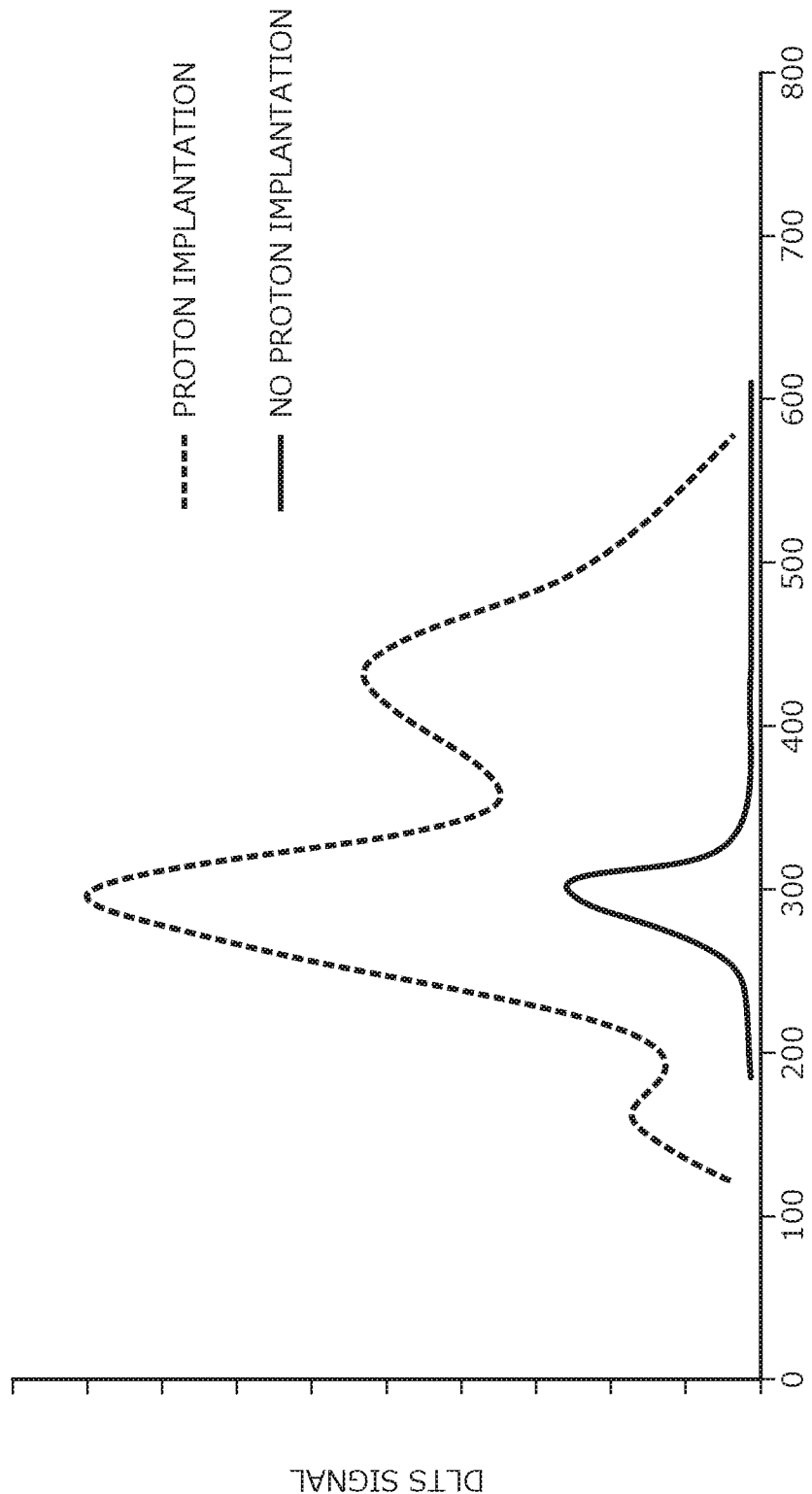
FIG. 4 is a graph of a DLTS signal of the silicon carbide semiconductor device according to the first embodiment.

Here, FIG. 4 is a graph of a DLTS signal of the silicon carbide semiconductor device according to the first embodiment. In FIG. 4, a vertical axis indicates strength of the DLTS signal and a horizontal axis indicates temperature in units of Kelvin (K). A deep level transient spectroscopy (DLTS) method is a technique enabling highly sensitive measurement of impurities and defects in a semiconductor material. FIG. 4 depicts a DLTS signal of a silicon carbide semiconductor material in which protons are implanted and a DLTS signal of a silicon carbide semiconductor material in which protons are not implanted. As depicted in FIG. 4, the silicon carbide semiconductor material into which protons were not implanted has a peak at 300K and the silicon carbide semiconductor material into which protons where implanted has peaks at 300K and 420K. Therefore, the silicon carbide semiconductor device into which protons were implanted at the interface of the n+-type silicon carbide semiconductor substrate 1 and the n-type boundary layer 2 may be detected by the DLTS method.

Figure 5:
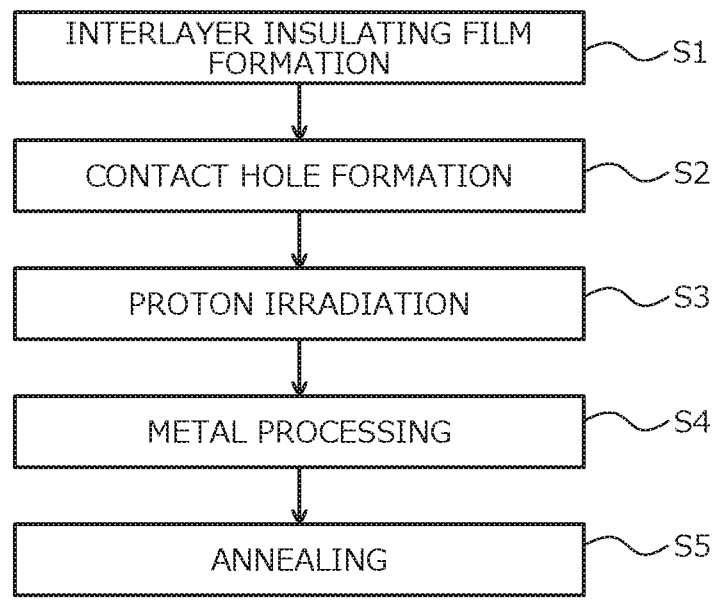
FIG. 5 is a flowchart depicting a part of manufacture of the silicon carbide semiconductor device according to the first embodiment.
Figure 6:
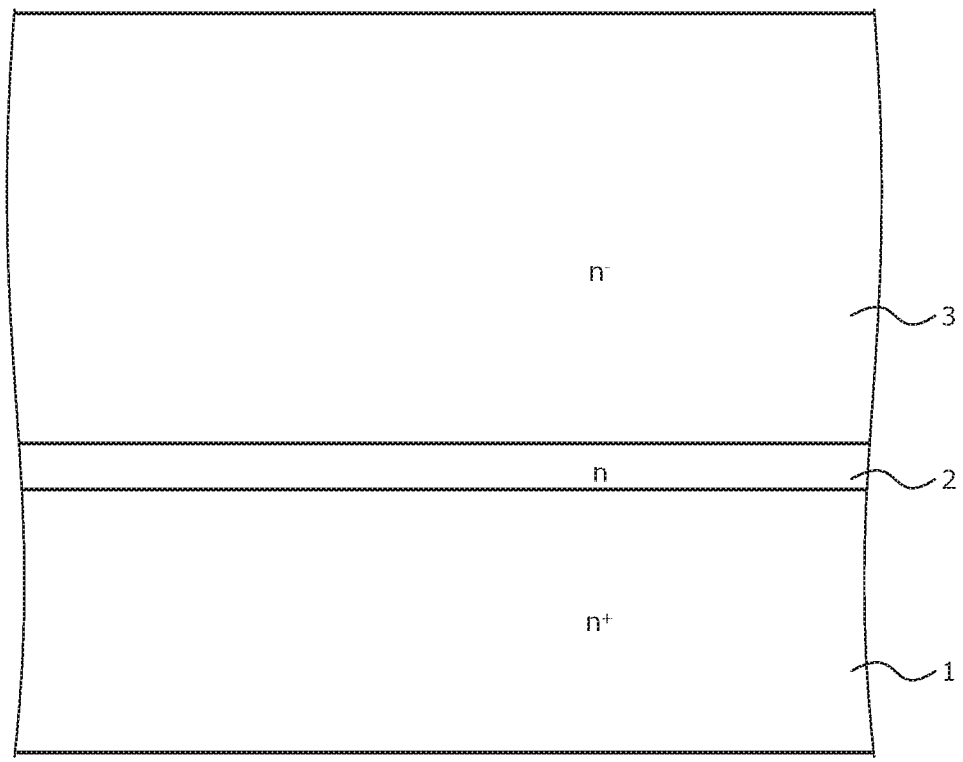
FIG. 6 is a cross-sectional view of the silicon carbide semiconductor device according to the first embodiment during manufacture.
Figure 7:
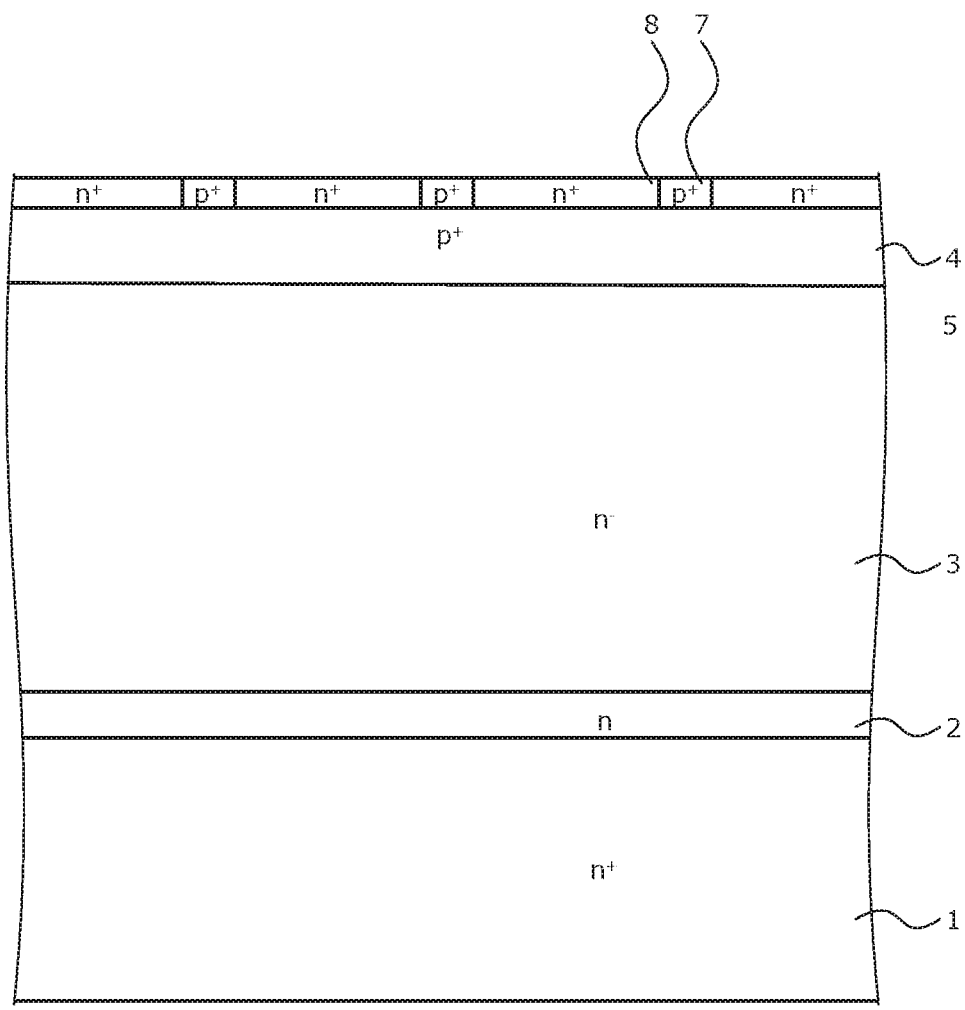
FIG. 7 is a cross-sectional view of the silicon carbide semiconductor device according to the first embodiment during manufacture.
Figure 8:
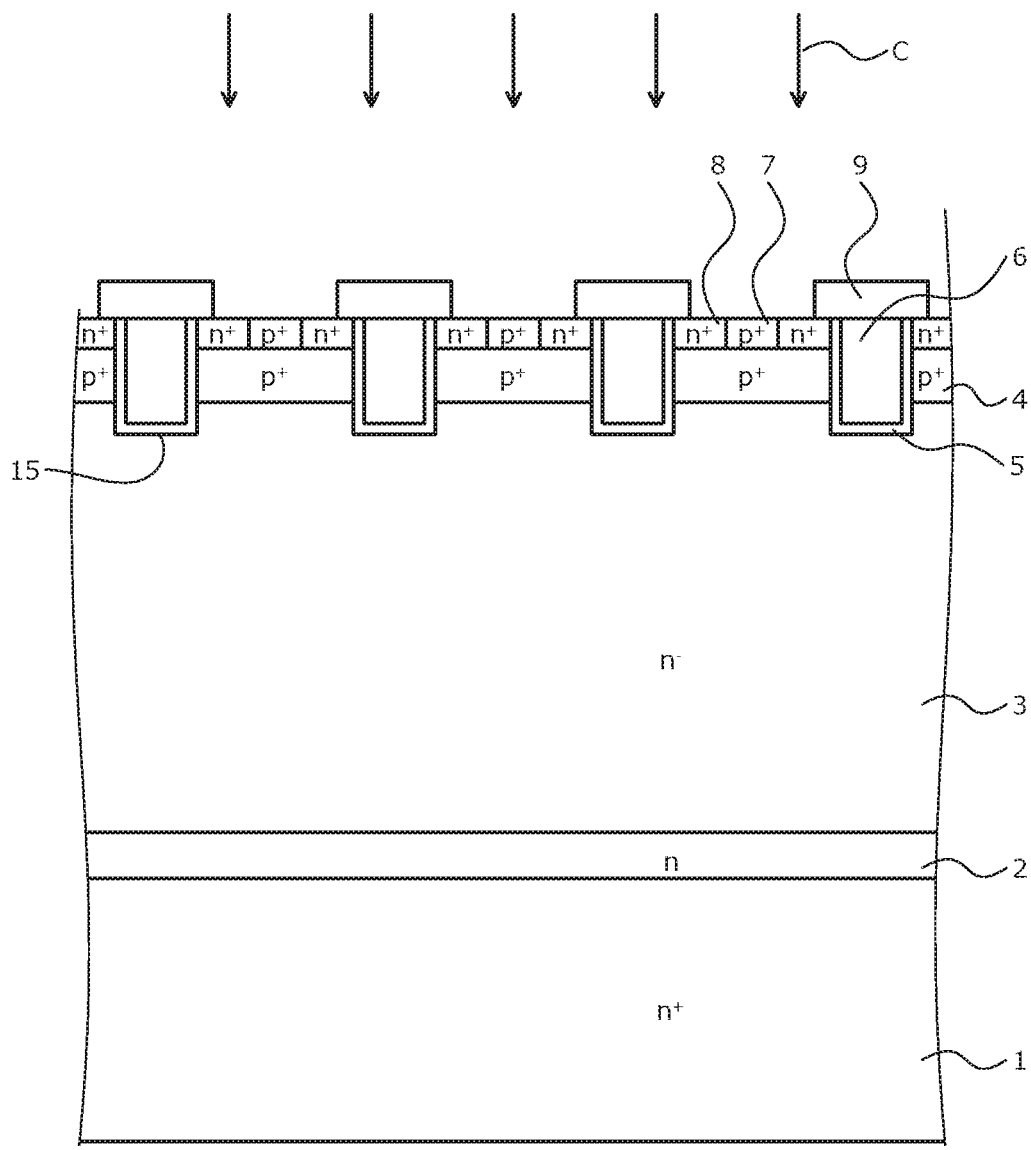
FIG. 8 is a cross-sectional view of the silicon carbide semiconductor device according to the first embodiment during manufacture.

A method of manufacturing the silicon carbide semiconductor device according to the first embodiment will be described. FIG. 5 is a flowchart depicting a part of the manufacture of the silicon carbide semiconductor device according to the first embodiment. FIGS. 6, 7, and 8 are cross-sectional views of the silicon carbide semiconductor device according to the first embodiment during manufacture. In FIG. 5, processes related to proton irradiation of the present invention will be described in detail.

First, the n+-type silicon carbide semiconductor substrate 1 containing an n-type silicon carbide is prepared. Subsequently, on the first main surface of the n+-type silicon carbide semiconductor substrate 1, the n-type boundary layer 2 containing silicon carbide is formed by epitaxial growth while an n-type impurity, for example, nitrogen atoms, is doped. Next, on the n-type boundary layer 2, the n⁻-type drift layer 3 containing silicon carbide is formed by epitaxial growth while an n-type impurity, for example, nitrogen atoms, is doped. The state up to here is depicted in FIG. 6.

Next, on a surface of the n⁻-type drift layer 3, the p+-type base region 4 doped with a p-type impurity such as aluminum is formed. Next, on a surface of the p+-type base region 4, by photolithography, an ion implantation mask having a predetermined opening is formed by, for example, an oxide film. An n-type impurity such as phosphorus (P) is ion implanted in the opening, forming the n+-type source region 8 in a part of the surface of the p+-type base region 4. An impurity concentration of the n+-type source region 8 is set to be higher than an impurity concentration of the p+-type base region 4.

Next, the ion implantation mask used in forming the n+-type source region 8 is removed and by a similar method, an ion implantation mask having a predetermined opening is formed, a p-type impurity such as aluminum is ion implanted in a part of the surface of the p+-type base region 4, thereby forming the p+-type contact region 7. An impurity concentration of the p+-type contact region 7 is set to be higher than the impurity concentration of the p+-type base region 4. The state up to here is depicted in FIG. 7.

Next, heat treatment (annealing) is performed in an inert gas atmosphere at a temperature of about 1700 degrees C. and an activation process of the n+-type source region 8 and the p+-type contact region 7 is performed. As described, ion implantation regions may be collectively activated by one heat treatment session, or heat treatment and activation may be performed each time ion implantation is performed.

Next, on a surface of the p+-type base region 4, by photolithography, a trench formation mask having predetermined openings is formed using, for example, an oxide film. Next, by dry etching, the trenches 15 are formed penetrating the p+-type base region 4 and reaching the n⁻-type drift layer 3. Next, the trench formation mask is removed.

Next, along surfaces of the n+-type source region 8 and the p+-type contact region 7 and along the side walls and the bottom of the trenches 15, the gate insulating film 5 is formed. The gate insulating film 5 may be formed by thermal oxidation by heat treatment in an oxygen atmosphere at a temperature of about 1000 degrees C. Further, the gate insulating film 5 may be formed by a deposition method by a chemical reaction such as that for a high temperature oxide (HTO).

Next, on the gate insulating film 5, for example, a polycrystalline silicon layer doped with phosphorus atoms is formed. The polycrystalline silicon layer may be formed so as to be embedded in the trenches 15. The polycrystalline silicon layer is patterned by photolithography so as to remain in the trenches 15, where by the gate electrodes 6 are formed.

Next, for example, a phosphorus glass having a thickness of about 1 μm is formed so as to cover the gate insulating film 5 and the gate electrode 6, whereby the interlayer insulating film 9 is formed (step S1). Next, a barrier metal (not depicted) made of titanium (Ti) or titanium nitride (TiN) may be formed so as to cover the interlayer insulating film 9. Next, the interlayer insulating film 9 and the gate insulating film 5 are patterned by photolithography, forming a contact hole in which the n+-type source region 8 and the p+-type contact region 7 are exposed (step S2). Thereafter, heat treatment (reflow) is performed and the interlayer insulating film 9 is planarized.

Next, from the first main surface side (p$^+$-type base region 4 side) of the silicon carbide semiconductor base, protons are irradiated (step S3). The protons are irradiated near the interface of the n$^+$-type silicon carbide semiconductor substrate 1 and the n-type boundary layer 2, as indicated by arrow C in FIG. 8. The state up to here is depicted in FIG. 8.

Next, in the contact hole and on the interlayer insulating film 9, a conductive film, such as a nickel (Ni) film, constituting the source electrode 10 is formed (step S4). The conductive film is patterned by photolithography, leaving the source electrode 10 only in the contact hole.

Next, on the second main surface of the n$^+$-type silicon carbide semiconductor substrate 1, a rear electrode of nickel or the like is formed. Thereafter, heat treatment (annealing) at a temperature of about 420 degrees C. is performed (step S5). At a temperature higher than 420 degrees C., crystal defects due to implanted protons are eliminated and no longer function as a lifetime killer. Subsequently, the source electrode 10 and rear electrode forming ohmic junctions with the n$^+$-type source region 8, the p$^+$-type contact region 7 and the n$^+$-type silicon carbide semiconductor substrate 1 are formed.

Next, on the first main surface of the silicon carbide semiconductor base, by a sputtering method, an aluminum film having a thickness of about 5 μm is deposited and removed by photolithography so as to cover the source electrode 10 and the interlayer insulating film 9, thereby forming the source electrode pad.

On a surface of the rear electrode, for example, titanium (Ti), nickel and gold (Au) are sequentially stacked, thereby forming the drain electrode pad (not depicted). Thus, the silicon carbide semiconductor device depicted in FIG. 1 is completed.

As described, according to the silicon carbide semiconductor device of the first embodiment, protons are implanted as a lifetime killer near the interface of the n$^+$-type silicon carbide semiconductor substrate and the n-type boundary layer. As a result, the hole density of the interface of the n$^+$-type silicon carbide semiconductor substrate and the n-type boundary layer is reduced and the growth of crystal defects may be suppressed. Therefore, the silicon carbide semiconductor device according to the first embodiment enables current to flow in the built-in diode and may be used in an inverter in which fly back current flows in the built-in diode.

Further, when the high-concentration n-type epitaxial layer is formed by epitaxial growth, lifetime accuracy is dependent on concentration and film thickness, and varies greatly. On the other hand, in the first embodiment, proton irradiation is performed by ion implantation and therefore, control of the lifetime killer is good, enabling stable formation. Further, since proton irradiation is performed by ion implantation, fabrication at a lower cost than epitaxial growth is possible.

Figure 9:
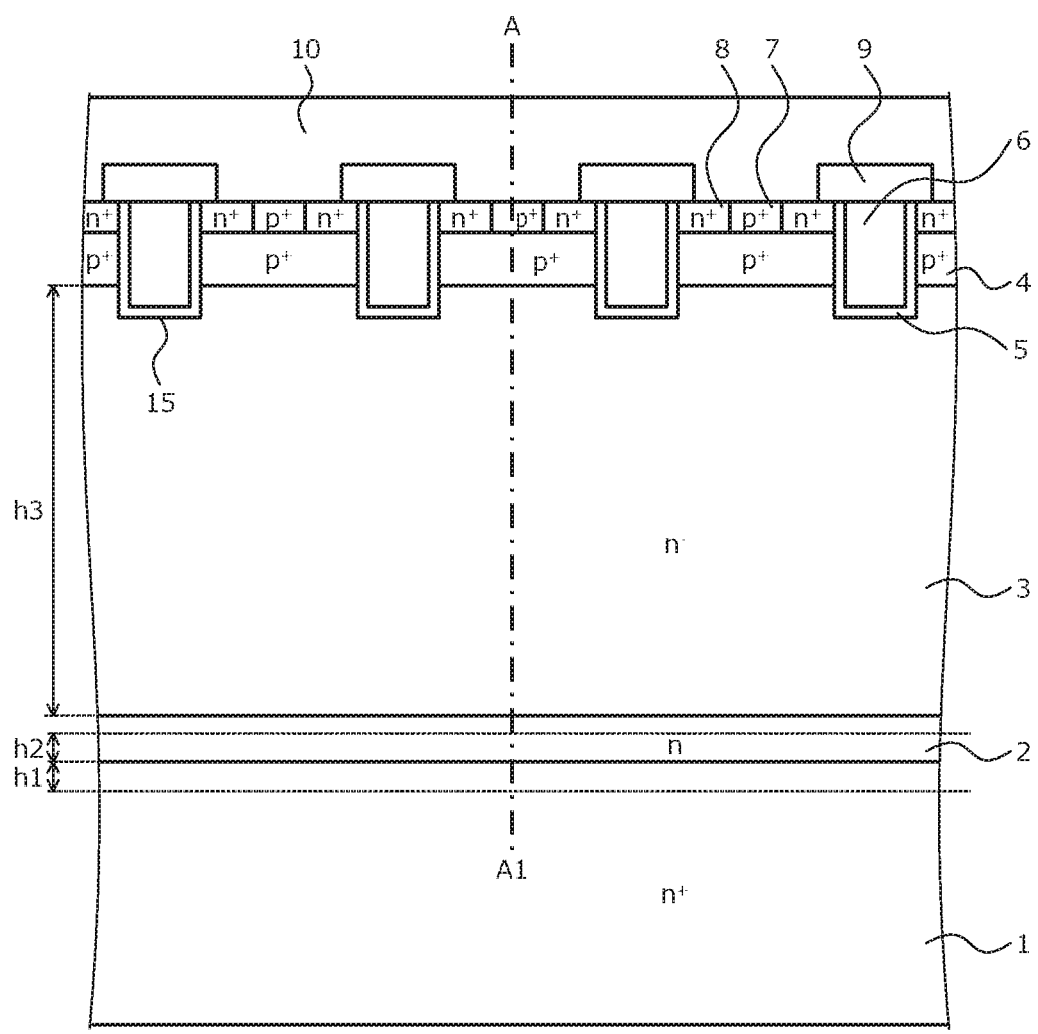
FIG. 9 is a cross-sectional view of a structure of the silicon carbide semiconductor device according to a second embodiment.

FIG. 9 is a cross-sectional view of a structure of the silicon carbide semiconductor device according to a second embodiment. The silicon carbide semiconductor device according to the second embodiment differs from the silicon carbide semiconductor device according to the first embodiment in that protons are also implanted in the n$^-$-type drift layer 3.

Figure 10:
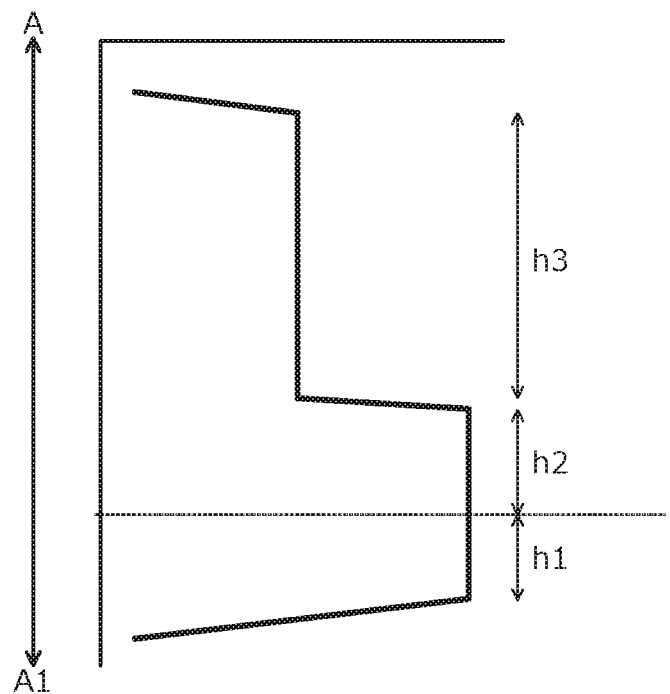
FIG. 10 is a graph of proton concentration of the silicon carbide semiconductor device according to the second embodiment.

As depicted in FIG. 9, protons are implanted in a region of the n$^-$-type drift layer 3, the region spanning a distance h3 from a surface of the n$^-$-type drift layer 3 facing toward the n-type boundary layer 2. The distance h3 is, for example, the film thickness of the n$^-$-type drift layer 3. FIG. 10 is a graph of proton concentration of the silicon carbide semiconductor device according to the second embodiment. FIG. 10 depicts the proton concentration of a part along line A-A' in FIG. 9. In FIG. 10, a vertical axis indicates depth from a surface of the p$^+$-type contact region 7 and a horizontal axis indicates proton concentration. Further, a dotted line parallel to the horizontal axis indicates the interface of the n$^+$-type silicon carbide semiconductor substrate 1 and the n-type boundary layer 2.

As depicted in FIG. 10, a concentration of the protons of the n$^-$-type drift layer 3 is lower than a concentration of the protons implanted in the n$^+$-type silicon carbide semiconductor substrate 1 and the n-type boundary layer 2. Injection of the protons into the n$^-$-type drift layer 3 at a low concentration enables Qrr (reverse recovery charge) of the silicon carbide semiconductor device to be reduced, and in a case of use in an inverter or the like, switching loss may be reduced.

Figure 11:
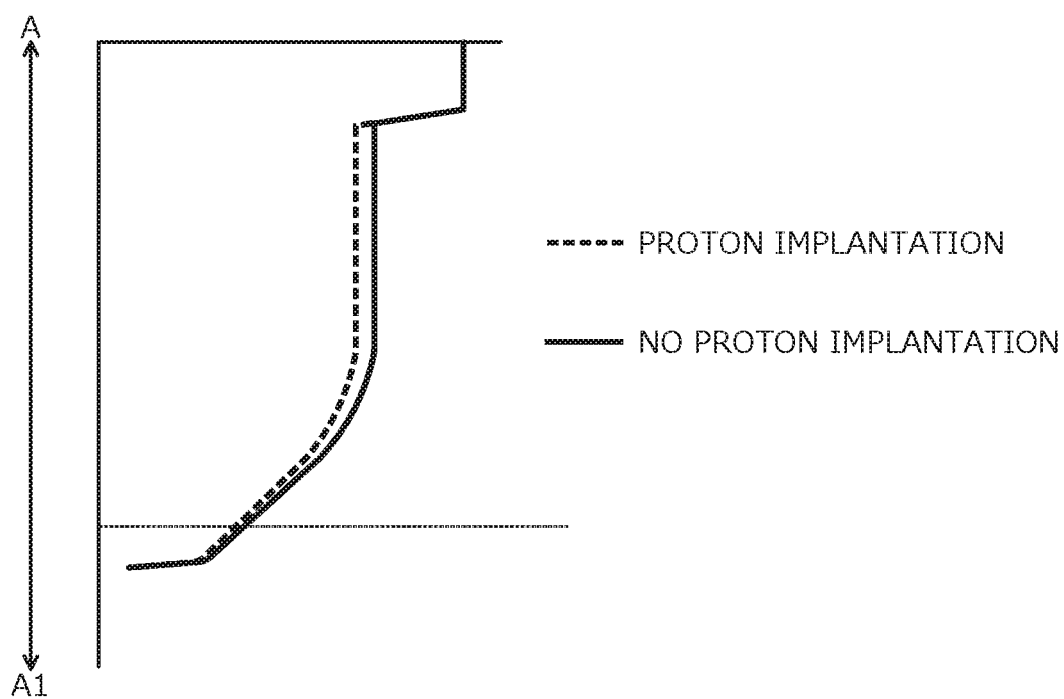
FIG. 11 is a graph of hole density of the silicon carbide semiconductor device according to the second embodiment.
Figure 12:
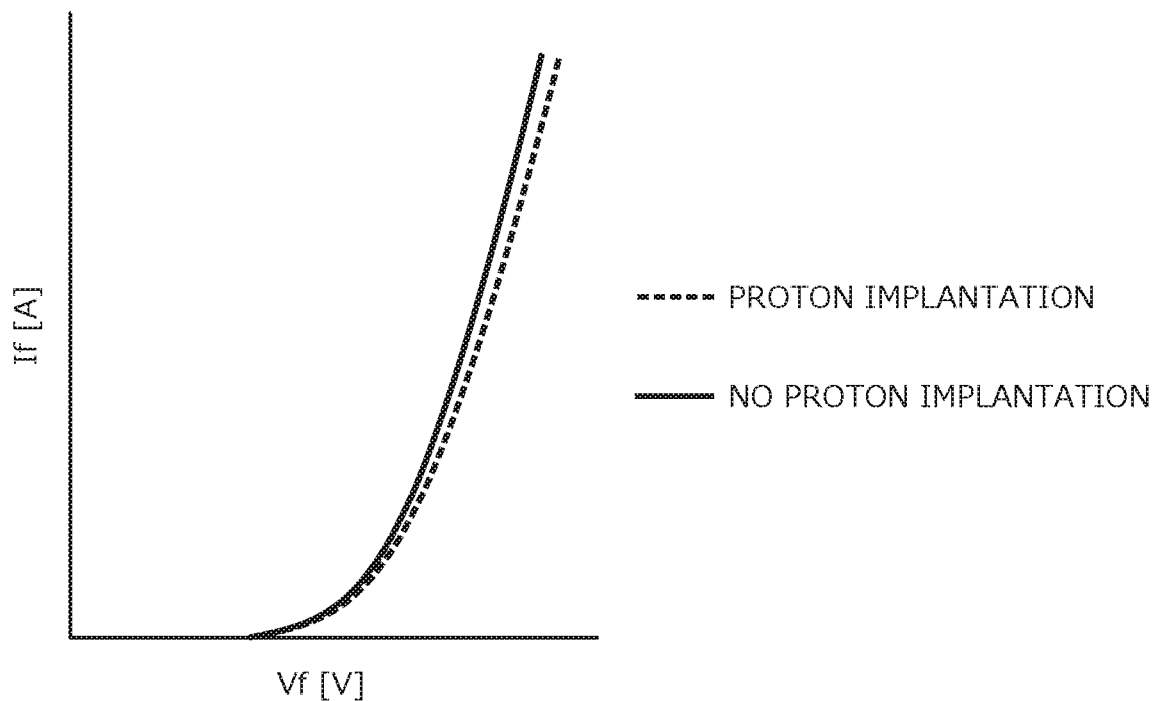
FIG. 12 is a graph of characteristics of a built-in diode of the silicon carbide semiconductor device according to the second embodiment.

Further, FIG. 11 is a graph of hole density of the silicon carbide semiconductor device according to the second embodiment. FIG. 11 depicts the hole density of a part along line A-A' in FIG. 9. In FIG. 11, a vertical axis indicates depth from a surface of the p$^+$-type contact region 7 and a horizontal axis indicates hole density. Further, a dotted line parallel to the horizontal axis indicates the interface of the n$^+$-type silicon carbide semiconductor substrate 1 and the n-type boundary layer 2. FIG. 12 is a graph of characteristics of the built-in diode of the silicon carbide semiconductor device according to the second embodiment. In FIG. 12, a vertical axis indicates forward current in units of A and a horizontal axis indicates forward voltage in units of V.

Figure 13:
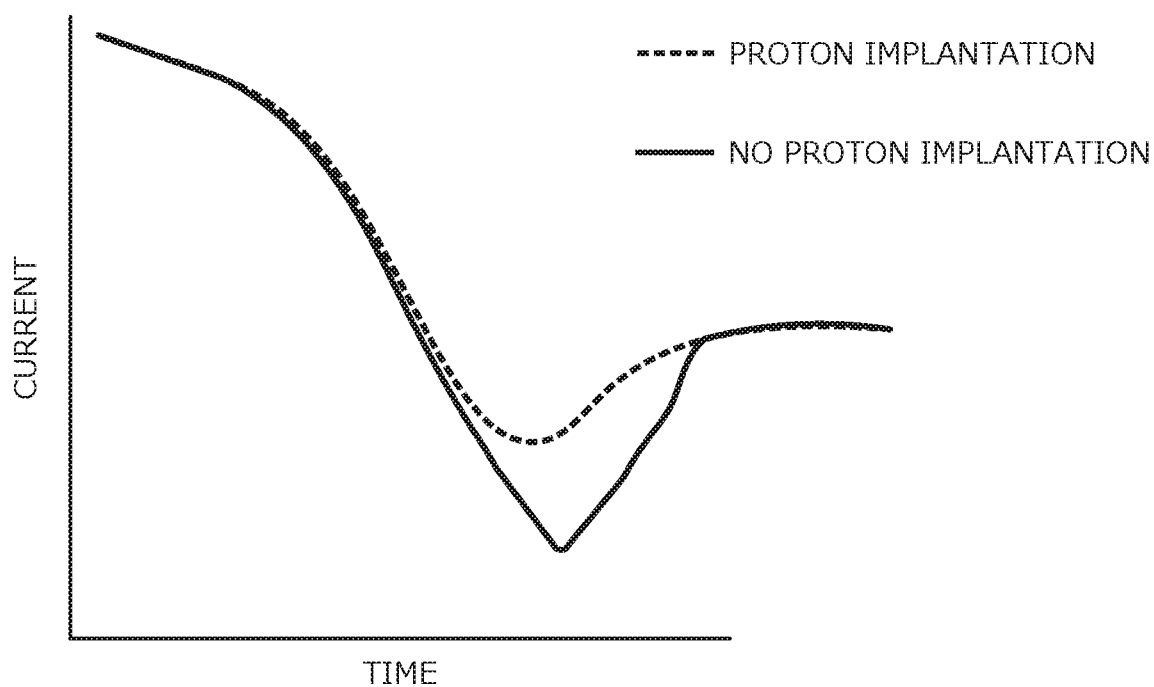
FIG. 13 is a graph of current characteristics of the silicon carbide semiconductor device according to the second embodiment at the time of reverse recovery.

As depicted in FIG. 11, when protons are implanted, as compared to a case when protons are not implanted, the hole density of the n$^-$-type drift layer 3 decreases. However, as depicted in FIG. 12, the decrease in the forward current is small and within a range enabling use of the built-in diode. FIG. 13 is a graph of current characteristics of the silicon carbide semiconductor device according to the second embodiment at the time of reverse recovery. In FIG. 13, a vertical axis indicates current and a horizontal axis indicates time. As depicted in FIG. 13, in a case in which protons are implanted, decrease of the current at the time of reverse recovery is small and Qrr decreases.

The silicon carbide semiconductor device according to the second embodiment is formed by also irradiating protons in the n$^-$-type drift layer 3 in the method of manufacturing the silicon carbide semiconductor device according to the first embodiment, before or after irradiating protons near the interface of the n$^+$-type silicon carbide semiconductor substrate 1 and the n-type boundary layer 2, from the first main surface side (p$^+$-type base region 4 side) of the silicon carbide semiconductor base.

As described, according to the silicon carbide semiconductor device of the second embodiment, near the interface of the n$^+$-type silicon carbide semiconductor substrate and the n-type boundary layer, protons are implanted as lifetime killers. As a result, effects similar to those of the first embodiment are achieved. Further, in the second embodiment, protons are also implanted in the n$^-$-type drift layer 3. As a result, Qrr of the silicon carbide semiconductor device may be reduced and in a case of use in an inverter, switching loss may be reduced.

A structure of the silicon carbide semiconductor device according to a third embodiment is similar to that of the silicon carbide semiconductor device according to the first embodiment and therefore, description will be omitted. The silicon carbide semiconductor device according to the third embodiment differs from the silicon carbide semiconductor device according to the first embodiment in that protons are implanted from the rear surface.

Figure 14:
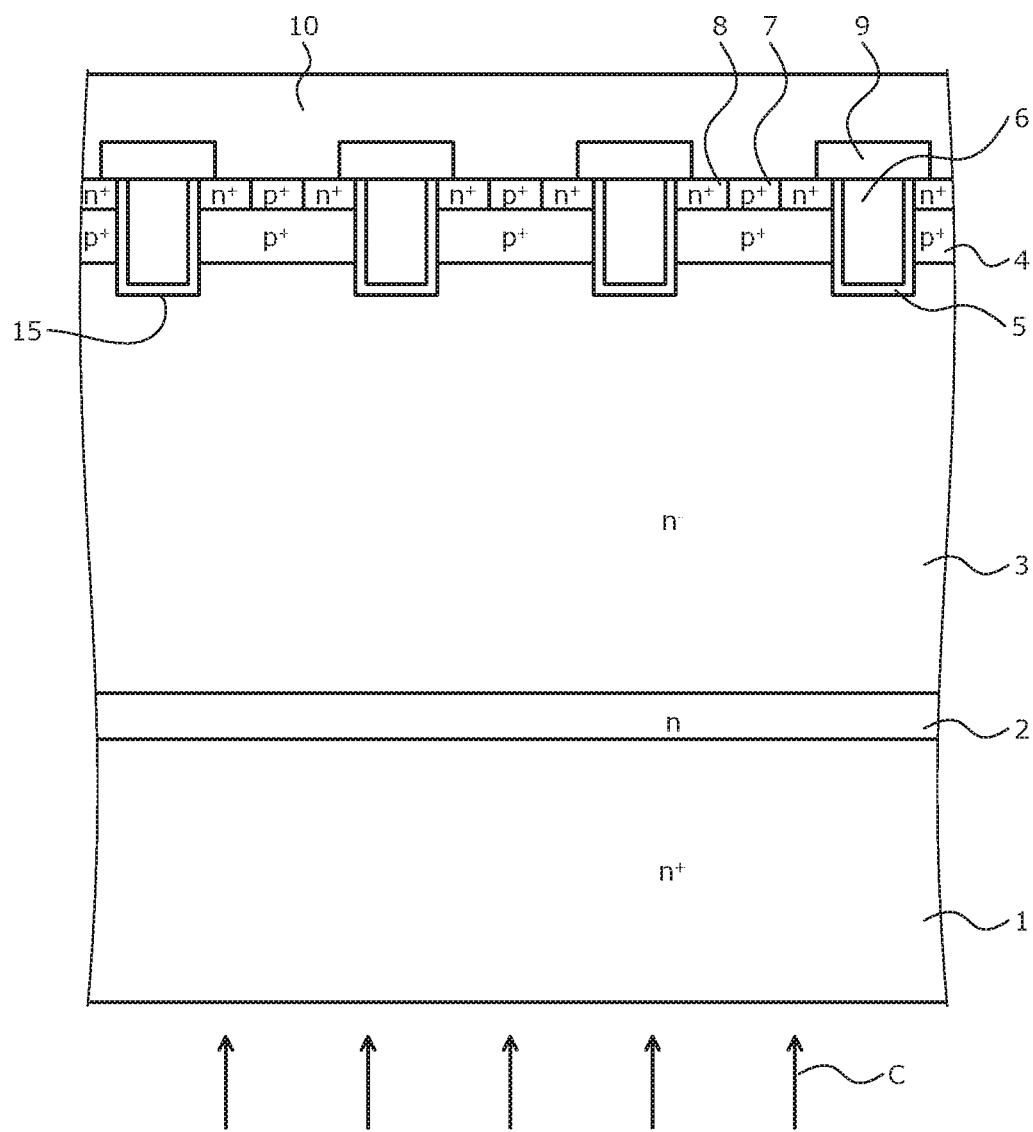
FIG. 14 is a cross-sectional view of the silicon carbide semiconductor device according to a third embodiment during manufacture.

FIG. 14 is a cross-sectional view of the silicon carbide semiconductor device according to the third embodiment during manufacture. The silicon carbide semiconductor device according to the third embodiment is manufactured by irradiating protons from the second main surface (rear surface, i.e., the rear surface of the silicon carbide semiconductor base) of the $n^+$-type silicon carbide semiconductor substrate 1 as indicated by arrow C in FIG. 14, when protons are irradiated near the interface of the $n^+$-type silicon carbide semiconductor substrate 1 and the n-type boundary layer 2 in the method of manufacturing the silicon carbide semiconductor device according to the first embodiment.

When protons are irradiated from the rear surface, for example, in a case where the film thickness of the substrate is 100 μm, the protons are irradiated at an accelerating voltage of 4 MeV. Irradiation of protons from the rear surface enables protons to be prevented from entering the gate insulating film 5 and a threshold value of the silicon carbide semiconductor device does not vary.

Figure 15:
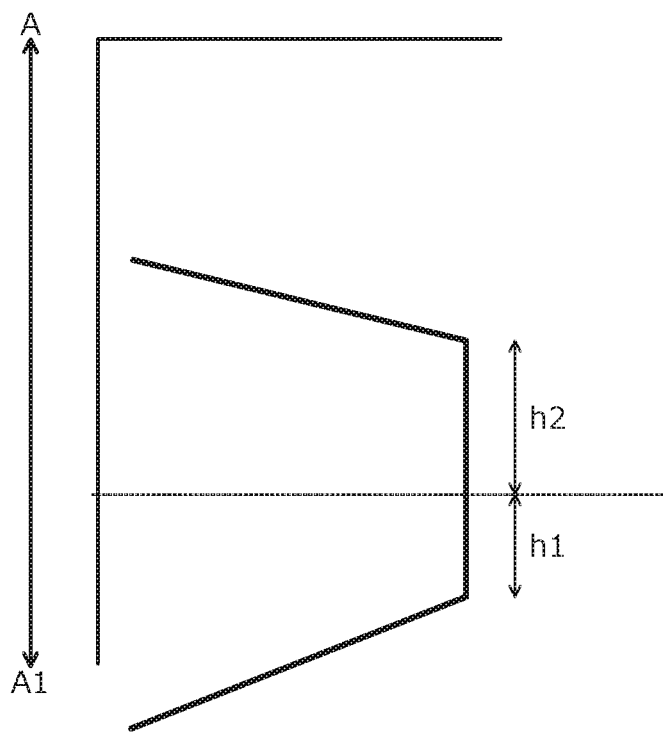
FIG. 15 is a graph of proton concentration of the silicon carbide semiconductor device according to the third embodiment.
Figure 16:
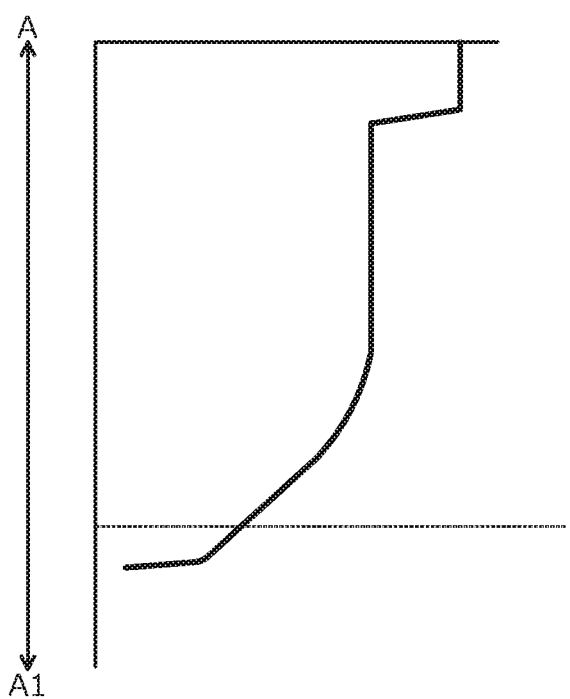
FIG. 16 is a graph of hole density of the silicon carbide semiconductor device according to the third embodiment.

Here, FIG. 15 is a graph of proton concentration of the silicon carbide semiconductor device according to the third embodiment. FIG. 16 is a graph of hole density of the silicon carbide semiconductor device according to the third embodiment. FIGS. 15 and 16 depict the proton concentration and the hole density of a part along line A-A' in FIG. 1. In FIGS. 15 and 16, vertical axes indicate depth from a surface of the $p^+$-type contact region 7 and horizontal axes indicate proton concentration and hole density, respectively. Further, dotted lines parallel to the horizontal axes indicate the interface of the $n^+$-type silicon carbide semiconductor substrate 1 and the n-type boundary layer 2. As depicted in FIGS. 15 and 16, even when protons are irradiated from the rear surface, the proton concentration and the hole density are the same as in a case where the protons are irradiated from the first main surface side.

As described, according to the silicon carbide semiconductor device of the third embodiment, protons are implanted from the rear surface as a lifetime killer near the interface of the $n^+$-type silicon carbide semiconductor substrate and the n-type boundary layer. As a result, effects similar to those of the first embodiment are achieved. Further, in the third embodiment, the protons are prevented from entering the gate insulating film and therefore, the threshold value of the silicon carbide semiconductor device does not vary.

Figure 17:
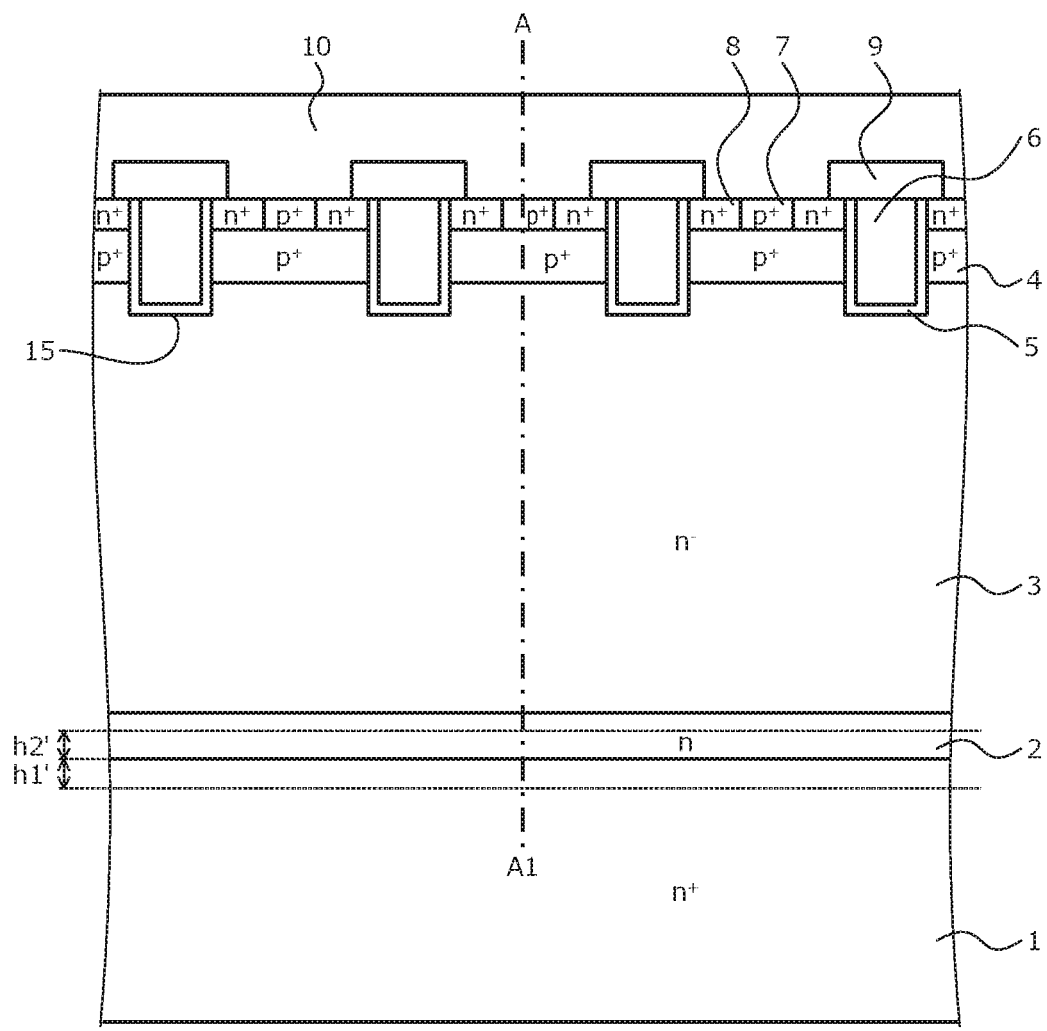
FIG. 17 is a cross-sectional view of a structure of the silicon carbide semiconductor device according to a fourth embodiment.

FIG. 17 is a cross-sectional view of a structure of the silicon carbide semiconductor device according to a fourth embodiment. The silicon carbide semiconductor device according to the fourth embodiment differs from the silicon carbide semiconductor device according to the first embodiment in that in place of protons, helium (He) is implanted.

As depicted in FIG. 17, for example, helium is implanted in a region of the $n^+$-type silicon carbide semiconductor substrate 1 at a distance h1' or greater from the surface of the $n^+$-type silicon carbide semiconductor substrate 1 facing toward the n-type boundary layer 2, and helium is implanted in a region of the n-type boundary layer 2 at a distance h2' or greater from the surface of the n-type boundary layer 2 facing toward the $n^+$-type silicon carbide semiconductor substrate 1. Here, values of h1', h2' are the same values of h1 (for example, 2 μm), h2 (for example, 3 μm) in the case of protons.

Similarly to protons, the helium becomes a lifetime killer, enabling the hole density of the interface of the $n^+$-type silicon carbide semiconductor substrate 1 and the n-type boundary layer 2 to be decreased by 100 times or more. As a result, hole and electron recombination is reduced, enabling the growth of crystal defects to be suppressed.

Figure 18:
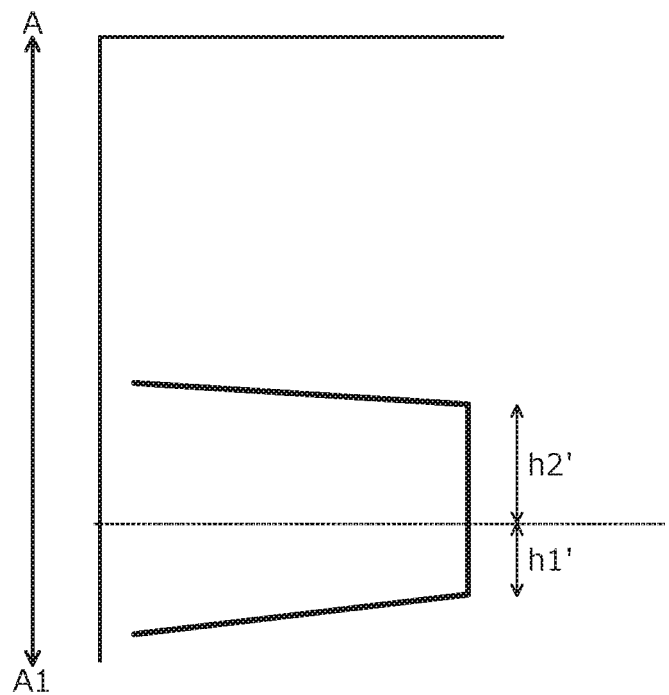
FIG. 18 is a graph of helium concentration of the silicon carbide semiconductor device according to the fourth embodiment.
Figure 19:
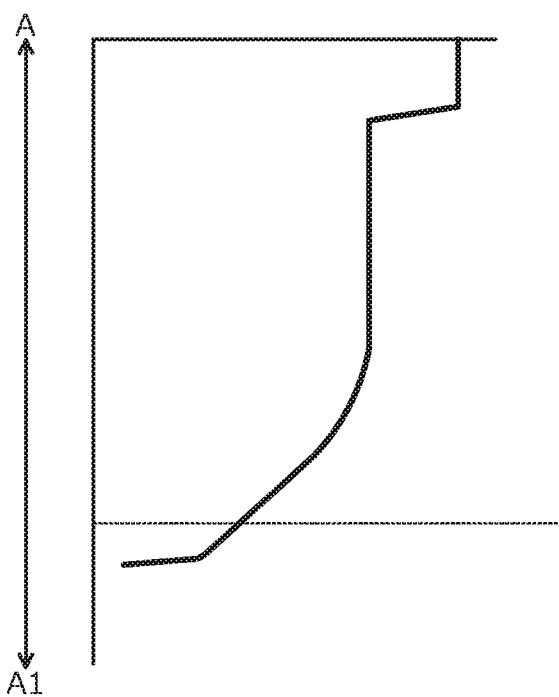
FIG. 19 is a graph of hole density of the silicon carbide semiconductor device according to the fourth embodiment.

Here, FIG. 18 is a graph of helium concentration of the silicon carbide semiconductor device according to the fourth embodiment. FIG. 19 is a graph of hole density of the silicon carbide semiconductor device according to the fourth embodiment. FIGS. 18 and 19 depict the helium concentration and the hole density of a part along line A-A' in FIG. 17. In FIGS. 18 and 19, vertical axes indicate depth from a surface of the $p^+$-type contact region 7 and horizontal axes indicated the helium concentration and the hole density, respectively. Further, dotted lines parallel to the horizontal axes indicate the interface of the $n^+$-type silicon carbide semiconductor substrate 1 and the n-type boundary layer 2. As depicted in FIGS. 18 and 19, even when helium is implanted, the hole density of the interface of the $n^+$-type silicon carbide semiconductor substrate 1 and the n-type boundary layer 2 may be reduced by 100 times or more.

The silicon carbide semiconductor device according to the fourth embodiment is manufactured by irradiating helium in place of protons near the interface of the $n^+$-type silicon carbide semiconductor substrate 1 and the n-type boundary layer 2, from the first main surface side ($p^+$-type base region 4 side) of the silicon carbide semiconductor base, in the method of manufacturing the silicon carbide semiconductor device according to the first embodiment. The helium is irradiated, for example, at an accelerating voltage of 3.5 MeV.

As described, according to the silicon carbide semiconductor device of the fourth embodiment, helium is implanted as a lifetime killer near the interface of the $n^+$-type silicon carbide semiconductor substrate and the n-type boundary layer. As a result, effects similar to those of the first embodiment are achieved.

Figure 20:
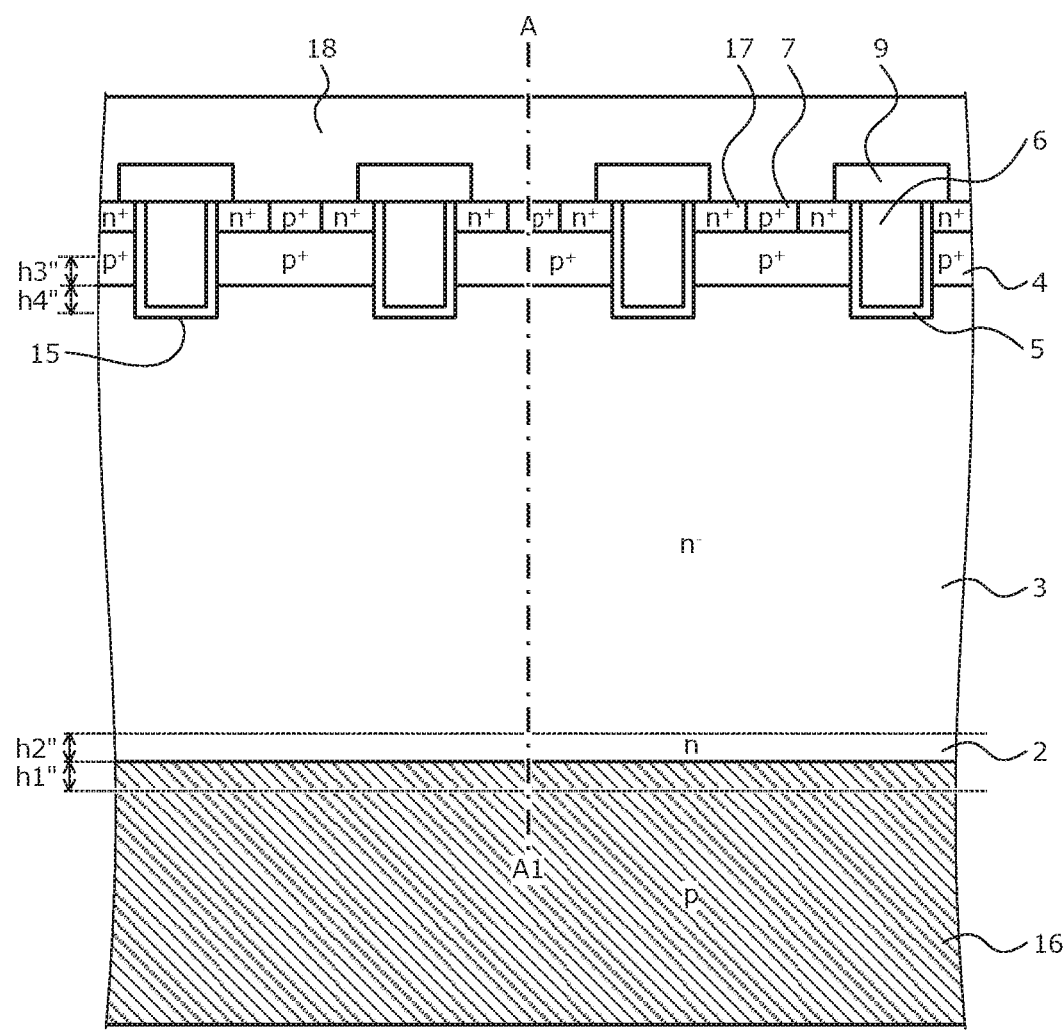
FIG. 20 is a cross-sectional view of a structure of the silicon carbide semiconductor device according to a fifth embodiment.

FIG. 20 is a cross-sectional view of a structure of the silicon carbide semiconductor device according to a fifth embodiment. In the fifth embodiment, a case is described in which the silicon carbide semiconductor device is an IGBT. As depicted in FIG. 20, a p-type silicon carbide semiconductor substrate 16 is provided and in the $p^+$-type base region 4, at the base first main surface side, an $n^+$-type emitter region 17 is selectively provided.

Further, an emitter electrode 18 is in contact with the $n^+$-type emitter region 17 and the $p^+$-type contact region 7, via a contact hole opened in the interlayer insulating film 9. At the second main surface (rear surface, i.e., the rear surface of the silicon carbide semiconductor base) of the p-type silicon carbide semiconductor substrate 16, the rear electrode (not depicted) is provided. The rear electrode constitutes a collector electrode. At a surface of the rear electrode, a collector electrode pad (not depicted) is provided. Other structures of the silicon carbide semiconductor device according to the fifth embodiment are similar to those of the silicon carbide semiconductor device according to the first embodiment.

In the silicon carbide semiconductor device of the fifth embodiment, protons are implanted as a lifetime killer near an interface of the p-type silicon carbide semiconductor substrate 16 and the n-type boundary layer 2, and near an interface of the $n^-$-type drift layer 3 and the $p^+$-type base region 4. The IGBT performs bipolar operation and therefore, crystal defects also grow from the interface of the $n^-$-type drift layer 3 and the $p^+$-type base region 4, and thus, protons are also implanted near the interface of the n⁻-type drift layer 3 and the p⁺-type base region 4.

The protons become a lifetime killer, enabling the hole density of the interface of the p-type silicon carbide semiconductor substrate 16 and the n-type boundary layer 2 and the hole density of the interface of the n⁻-type drift layer 3 and the p⁺-type base region 4 to be reduced. As a result, hole and electron recombination is reduced, enabling the growth of crystal defects to be suppressed.

Figure 21:
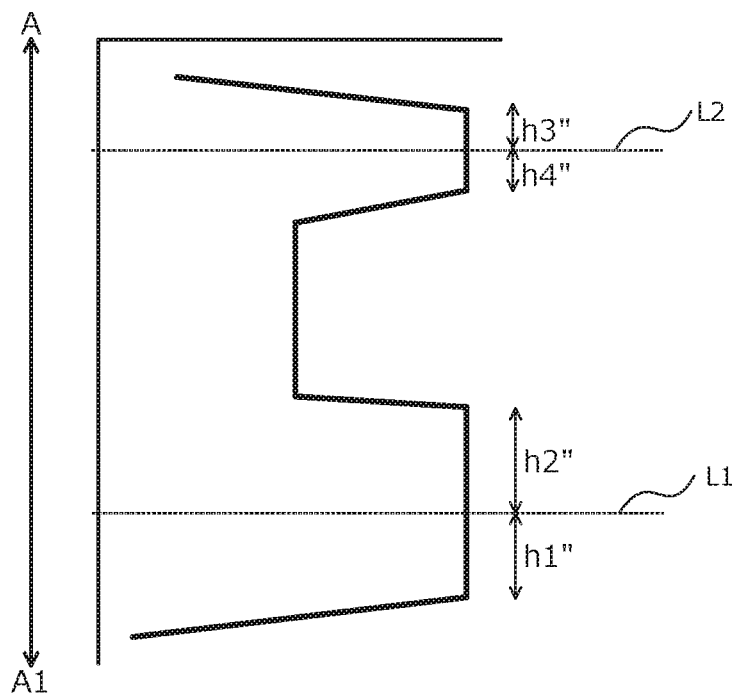
FIG. 21 is a graph of proton concentration of the silicon carbide semiconductor device according to the fifth embodiment.

FIG. 21 is a graph of proton concentration of the silicon carbide semiconductor device according to the fifth embodiment. FIG. 21 depicts proton concentration of a part along line A-A' in FIG. 20. In FIG. 21, a vertical axis indicates depth from a surface of the p⁺-type contact region 7 and a horizontal axis indicates proton concentration. Further, a dotted line L1 parallel to the horizontal axis indicates an interface of the p-type silicon carbide semiconductor substrate 16 and the n-type boundary layer 2 and a dotted line L2 parallel to the horizontal axis indicates the interface of the n⁻-type drift layer 3 and the p⁺-type base region 4.

As depicted in FIGS. 20 and 21, protons are implanted, for example, into a region of the p-type silicon carbide semiconductor substrate 16 at a distance h1" or greater from the surface of the p-type silicon carbide semiconductor substrate 16 facing toward the n-type boundary layer 2, and protons are implanted in a region of the n-type boundary layer 2 at a distance h2" or greater from the surface of the n-type boundary layer 2 facing toward the p-type silicon carbide semiconductor substrate 16. Further, protons, for example, are implanted in a region of the n⁻-type drift layer 3 at a distance h4" or greater from the surface of the n⁻-type drift layer 3 facing toward the p⁺-type base region 4, and protons are implanted are implanted in a region of the p⁺-type base region 4 at a distance h3" or greater from the surface of the p⁺-type base region 4 facing toward the n⁻-type drift layer 3.

Figure 22:
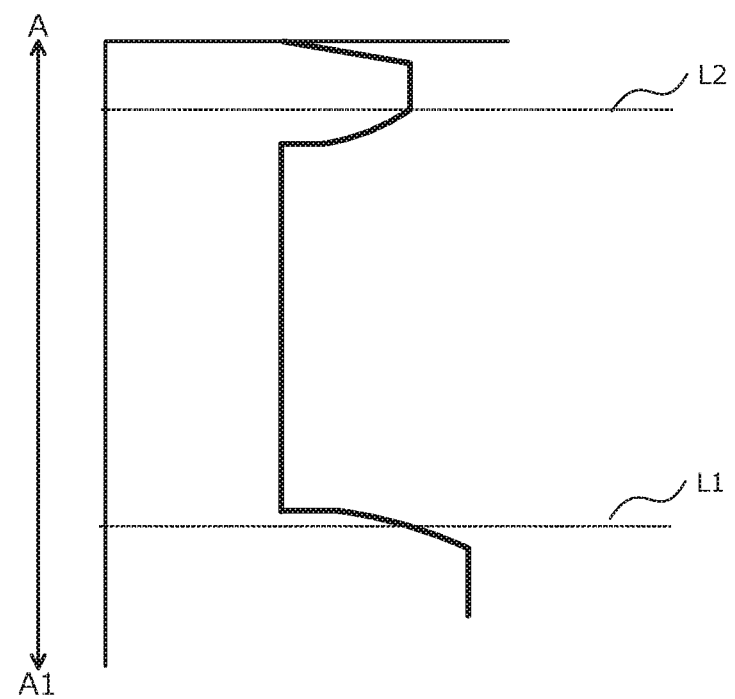
FIG. 22 is a graph of hole density of the silicon carbide semiconductor device according to the fifth embodiment.

Further, FIG. 22 is a graph of hole density of the silicon carbide semiconductor device according to the fifth embodiment. FIG. 22 depicts hole density of a part along line A-A' in FIG. 20. In FIG. 22, a vertical axis indicates depth from a surface of the p⁺-type contact region 7 and a horizontal axis indicates the hole density. Further, the dotted line L1 parallel to the horizontal axis indicates the interface of the p-type silicon carbide semiconductor substrate 16 and the n-type boundary layer 2 and the dotted line L2 parallel to the horizontal axis indicates the interface of the n⁻-type drift layer 3 and the p⁺-type base region 4. As depicted in FIG. 22, the hole density of the interface of the p-type silicon carbide semiconductor substrate 16 and the n-type boundary layer 2 and the hole density of the interface of the n⁻-type drift layer 3 and the p⁺-type base region 4 is reduced.

Figure 23:
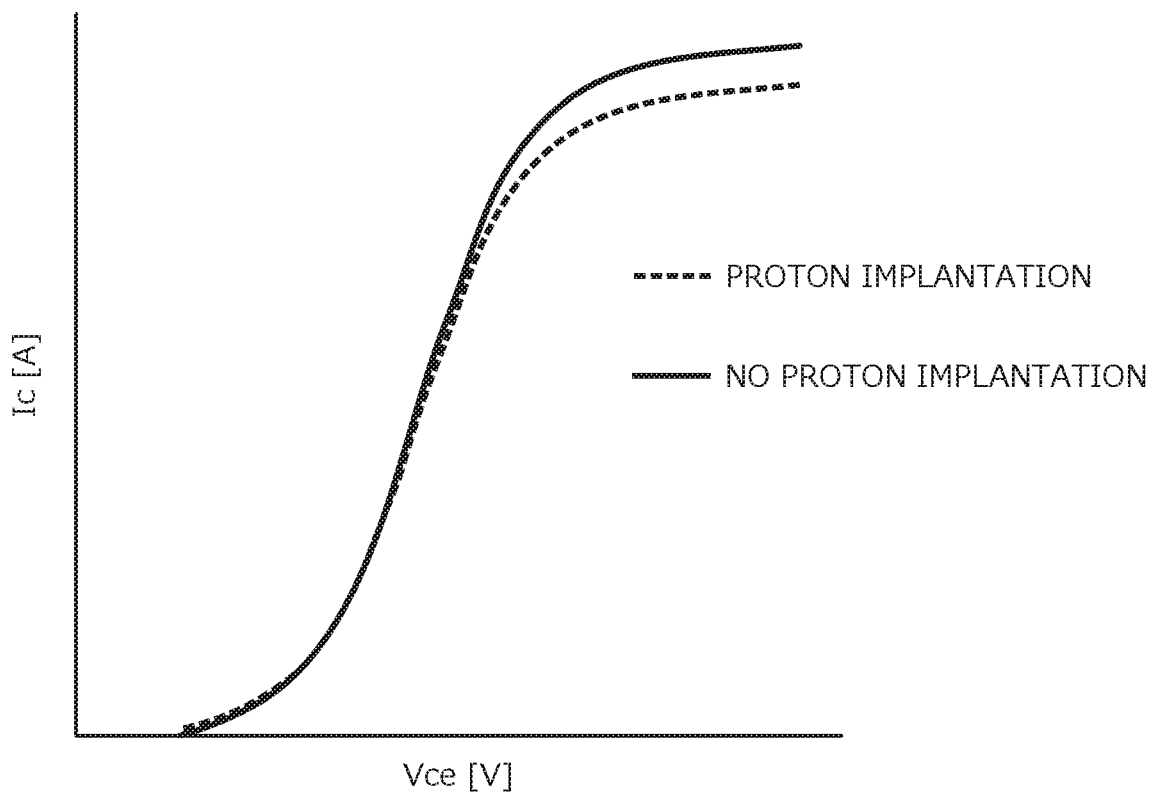
FIG. 23 is a graph of IcVce characteristics of the silicon carbide semiconductor device according to the fifth embodiment.

FIG. 23 is a graph of IcVce characteristics of the silicon carbide semiconductor device according to the fifth embodiment. In FIG. 23, a vertical axis indicates collector current Ic in units of A and a horizontal axis indicates voltage between the collector and emitter in units of V. As depicted in FIG. 23, even when protons are implanted and the hole density is reduced, IGBT characteristics do not significantly change.

The silicon carbide semiconductor device according to the fifth embodiment is manufactured by irradiating protons near the interface of the n⁻-type drift layer 3 and the p⁺-type base region 4 in the method of manufacturing the silicon carbide semiconductor device according to the first embodiment, before or after protons are irradiated near the interface of the p-type silicon carbide semiconductor substrate 16 and the n-type boundary layer 2.

As described, according to the silicon carbide semiconductor device of the fifth embodiment, protons are implanted as a lifetime killer near the interface of the p-type silicon carbide semiconductor substrate and the n-type boundary layer and near the interface of the n⁻-type drift layer and the p⁺-type base region. As a result, even in the IGBT, effects similar to those of the first embodiment are achieved.

Figure 24:
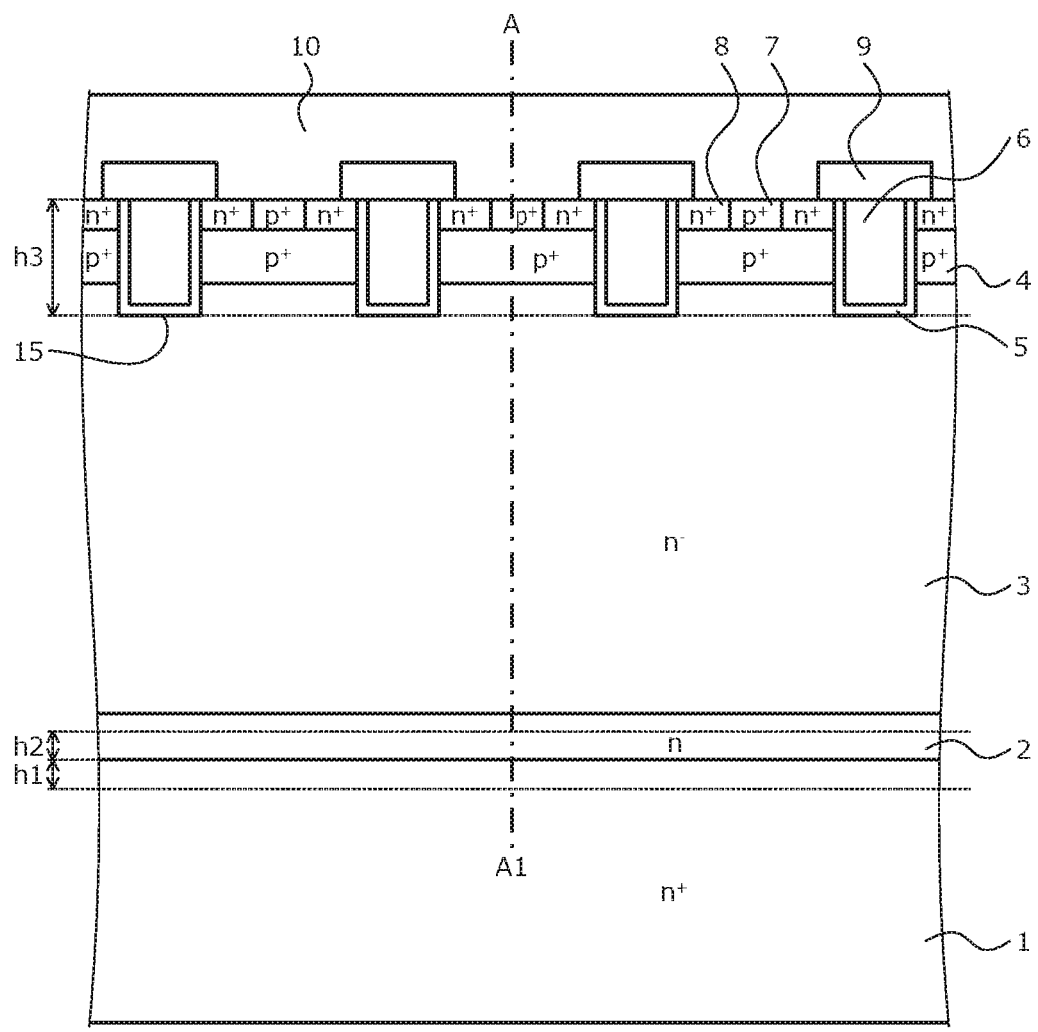
FIG. 24 is a cross-sectional view of a structure of the silicon carbide semiconductor device according to a sixth embodiment.

FIG. 24 is a cross-sectional view of a structure of the silicon carbide semiconductor device according to a sixth embodiment. The silicon carbide semiconductor device according to the sixth embodiment differs from the silicon carbide semiconductor device according to the first embodiment in that protons are also implanted in the gate insulating film 5.

Figure 25:
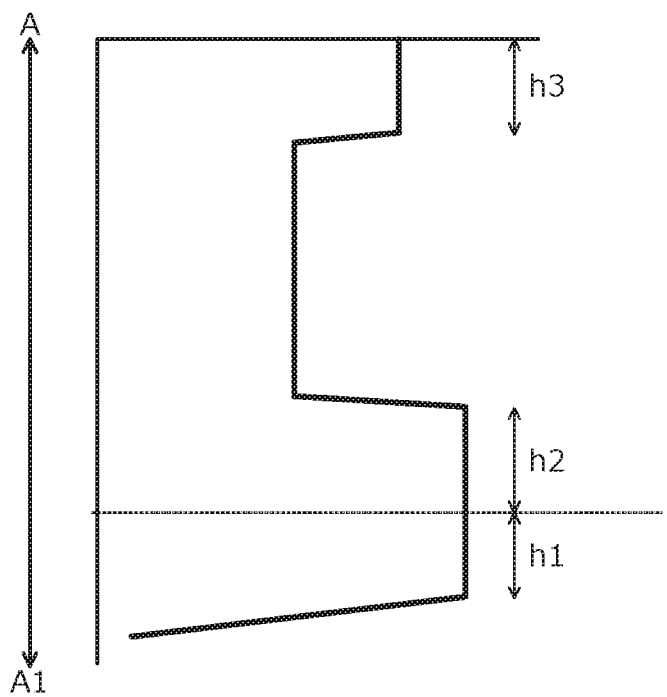
FIG. 25 is a graph of proton concentration of the silicon carbide semiconductor device according to the sixth embodiment.

FIG. 25 is a graph of proton concentration of the silicon carbide semiconductor device according to the sixth embodiment. FIG. 25 depicts the proton concentration of a part along line A-A' in FIG. 24. In FIG. 25, a vertical axis indicates depth from a surface of the p⁺-type contact region 7 and a horizontal axis indicates the proton concentration. Further, a dotted line parallel to the horizontal axis indicates the interface of the n⁺-type silicon carbide semiconductor substrate 1 and the n-type boundary layer 2. As depicted in FIGS. 24 and 25, protons are implanted in a region of the p⁺-type base region 4, the region spanning the distance h3 from a surface of the p⁺-type base region 4 facing toward the source electrode 10. The distance h3 is a depth of the trench 15 in which the gate insulating film 5 is provided.

Figure 26:
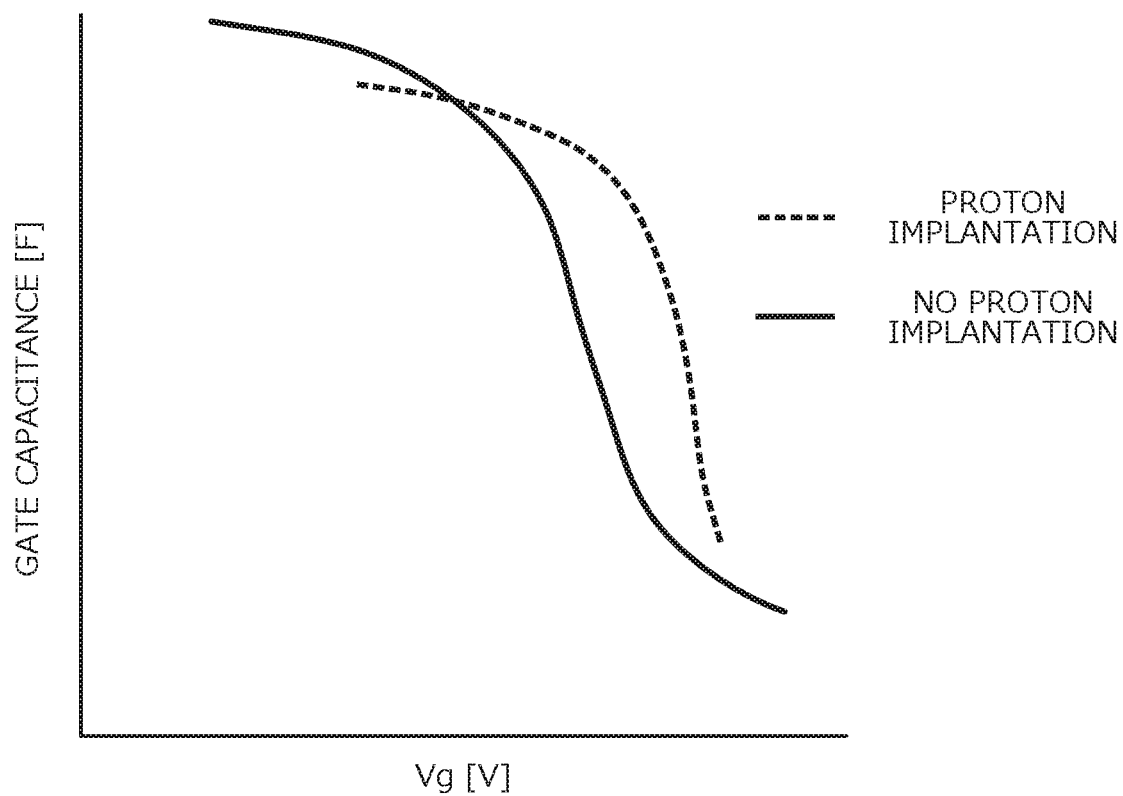
FIG. 26 is a graph of CV characteristics of the silicon carbide semiconductor device according to the sixth embodiment.

FIG. 26 is a graph of CV characteristics of the silicon carbide semiconductor device according to the sixth embodiment. In FIG. 26, a vertical axis indicates capacitance of the gate insulating film 5 in units of F and a horizontal axis indicates gate voltage in units of V. As depicted in FIG. 26, the hole density of the gate insulating film 5 is reduced by proton implantation, whereby the CV characteristics are improved. Therefore, the proton implantation enables a product to be manufactured having the gate insulating film 5 that is favorable.

The silicon carbide semiconductor device according to the sixth embodiment is manufactured by also irradiating protons in the gate insulating film 5 in the method of manufacturing the silicon carbide semiconductor device according to the first embodiment, before or after irradiating protons near the interface of the n⁺-type silicon carbide semiconductor substrate 1 and the n-type boundary layer 2, from the first main surface side (p⁺-type base region 4 side) of the silicon carbide semiconductor base.

As described, according to the silicon carbide semiconductor device of the sixth embodiment, protons are implanted as a lifetime killer near the interface of the n⁺-type silicon carbide semiconductor substrate and the n-type boundary layer. As a result, effects similar to those of the first embodiment are achieved. Further, in the sixth embodiment, protons are also implanted in the gate insulating film 5. As a result, a product may be manufactured having the gate insulating film 5 that is favorable and the CV characteristics may be improved.

Figure 27:
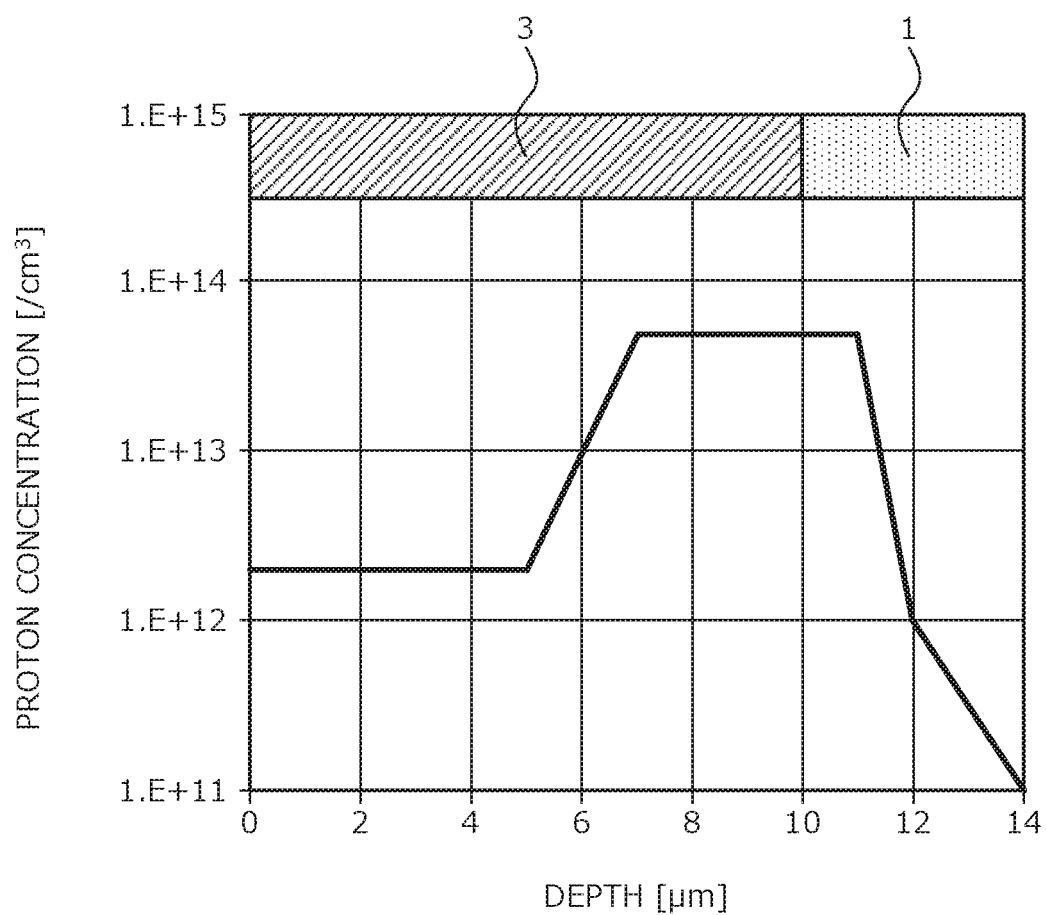
FIG. 27 is a graph of proton concentration of a silicon carbide semiconductor device of an example.
Figure 28:
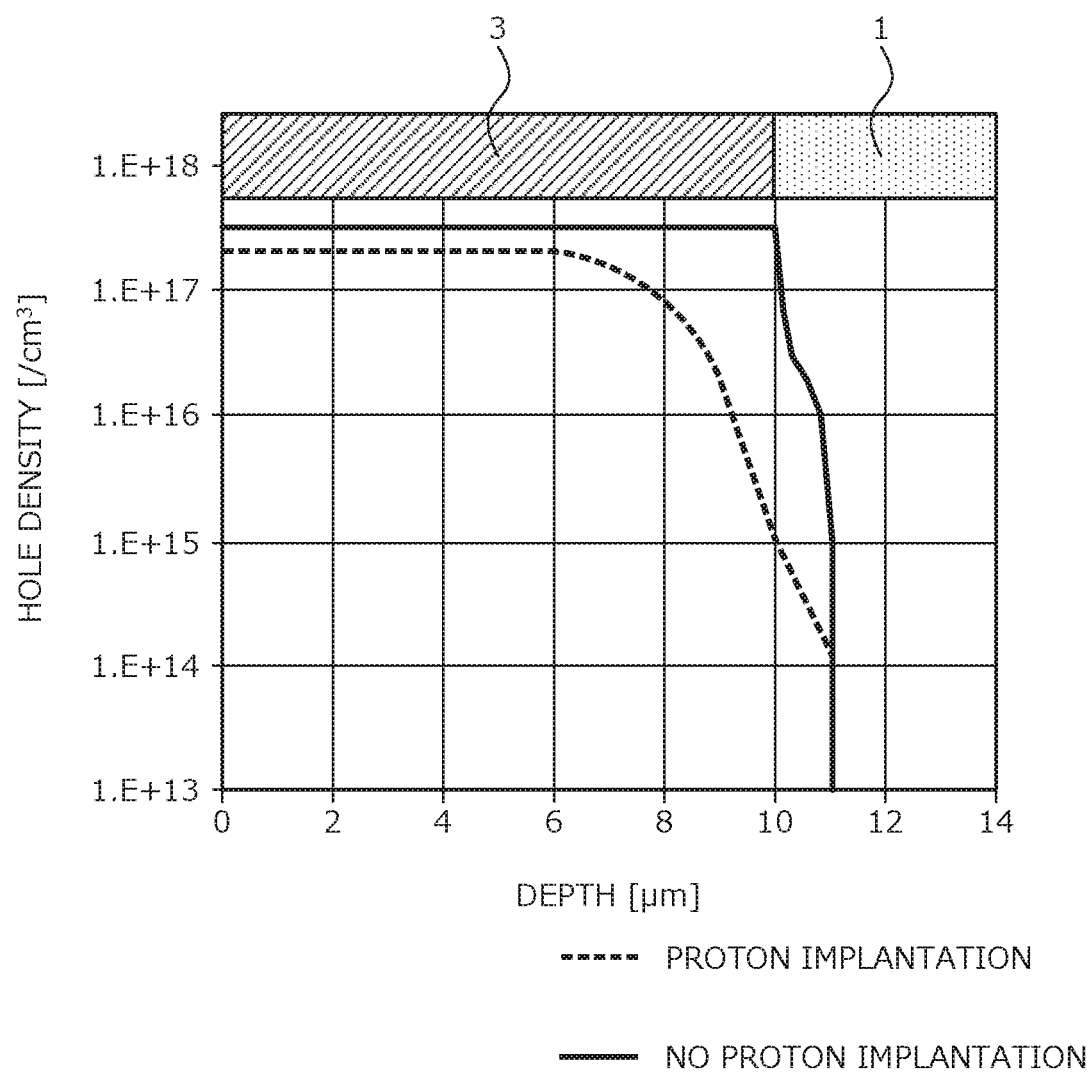
FIG. 28 is a graph of hole density of a silicon carbide semiconductor device of an example.
Figure 29:
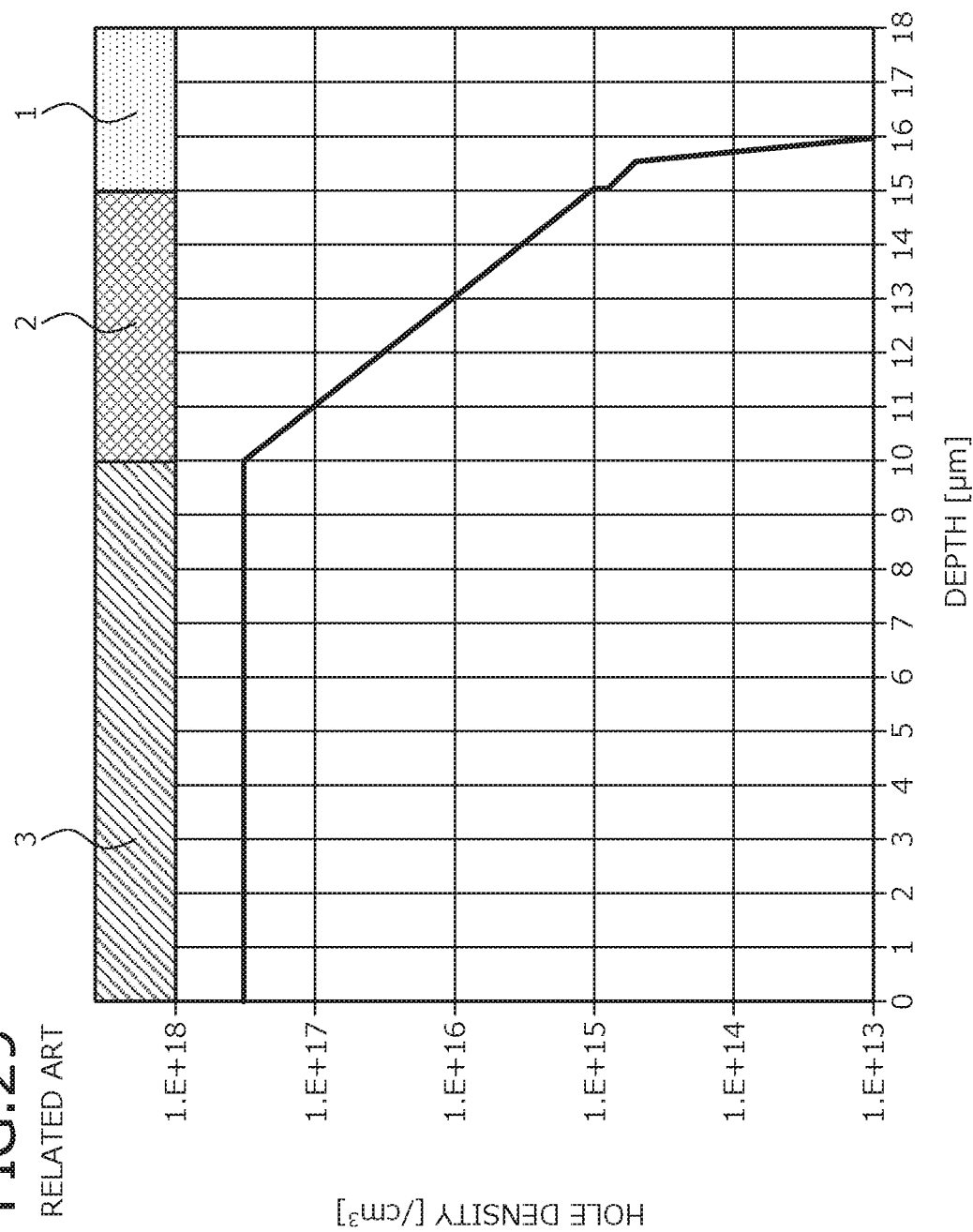
FIG. 29 is a graph of hole density of a silicon carbide semiconductor device of a conventional example.
Figure 30:
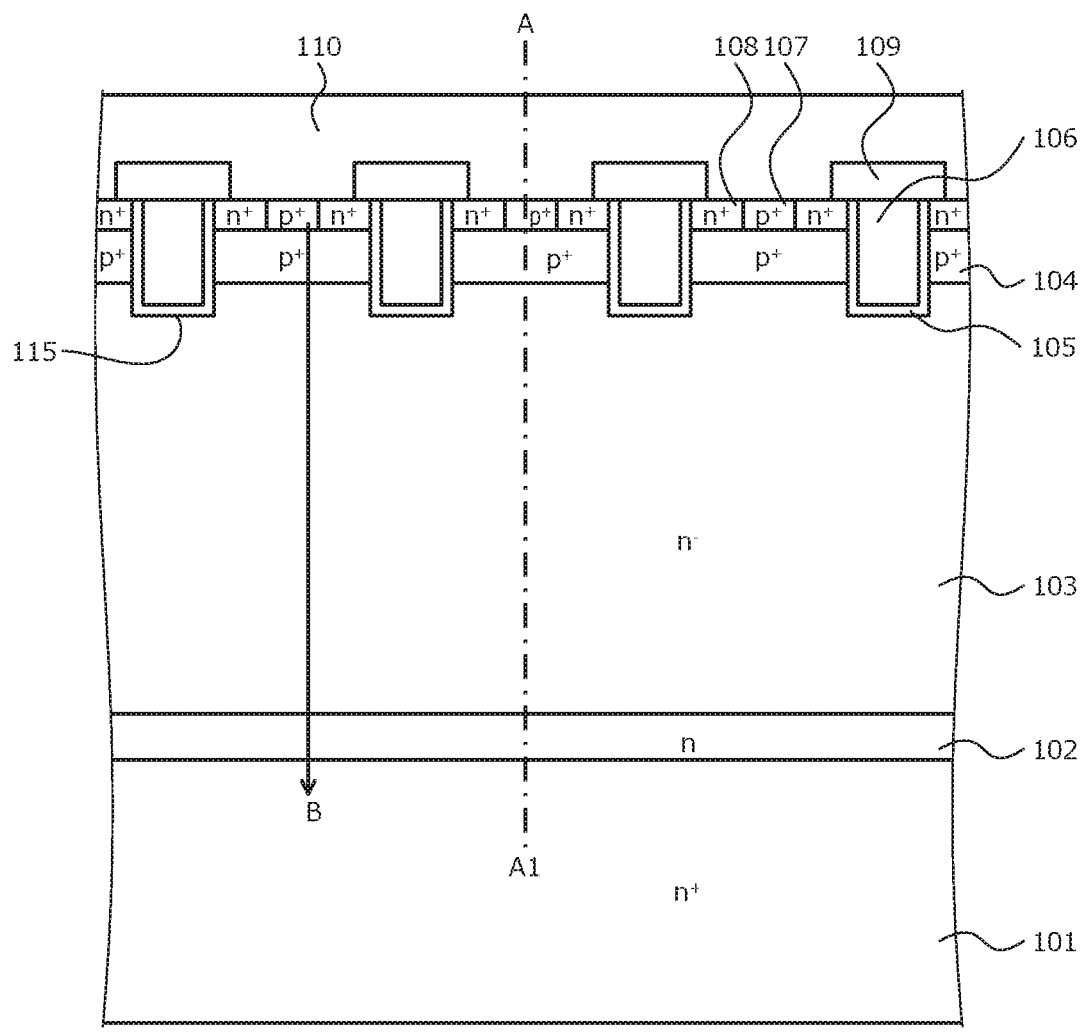
FIG. 30 is a cross-sectional view of a structure of a conventional silicon carbide semiconductor device.
Figure 31:
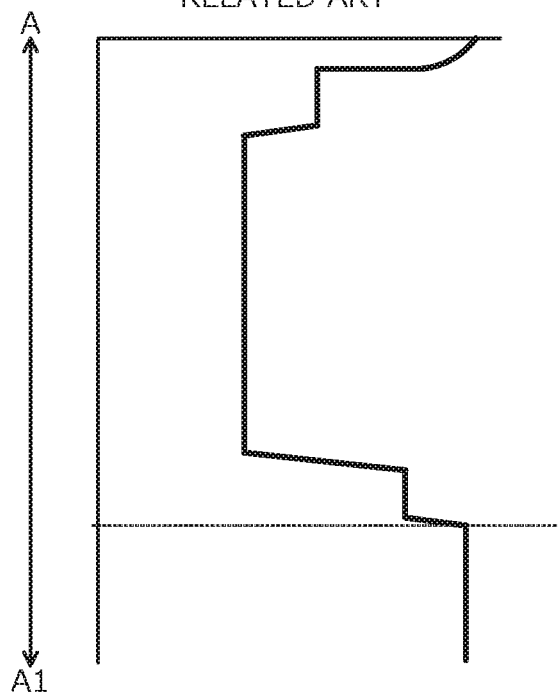
FIG. 31 is a graph of impurity concentrations of the conventional silicon carbide semiconductor device.

FIG. 27 is a graph of proton concentration of a silicon carbide semiconductor device of an example. Further, FIG. 28 is a graph of hole density of the silicon carbide semiconductor device of the example. FIG. 29 is a graph of hole density of a silicon carbide semiconductor device of a conventional example. In FIG. 27, a vertical axis indicates proton concentration in units/cm³. Further, a horizontal axis indicates depth from a surface of the n⁻-type drift layer 3 in units of μm. In FIGS. 28 and 29, a vertical axis indicates hole density in units/cm³ and a horizontal axis indicates depth from a surface of the n⁻-type drift layer 3 in units of μm.

FIG. 27 depicts proton concentration when the silicon carbide semiconductor device of the first embodiment is simulated. FIG. 28 depicts hole density when the silicon carbide semiconductor device of the first embodiment and the silicon carbide semiconductor device of the conventional example are simulated. FIGS. 27 and 28 are examples in which the n-type boundary layer 2 is not provided in the silicon carbide semiconductor device of the first embodiment. Further, FIG. 29 depicts hole density when the silicon carbide semiconductor device of the conventional example is simulated.

As depicted in FIGS. 28 and 29, protons become a lifetime killer and the hole density at the interface of the n⁺-type silicon carbide semiconductor substrate 1 and the n⁻-type drift layer 3 decreases more than when the protons are not implanted.

In the embodiments of the present invention, various modifications within a range not departing from the spirit of the invention are possible. For example, dimensions, impurity concentrations, etc. regions may be variously set according to required specifications. Further, in the embodiments, the first conductivity type is assumed to be an n-type and the second conductivity type is assumed to be a p-type; however, the present invention is similarly implemented when the first conductivity type is a p-type and the second conductivity type is an n-type. Further, while semiconductor device having a MOS structure has been described, application to a bipolar semiconductor device is also possible.

According to the embodiments of the present invention, protons are implanted as a lifetime killer near the interface of the semiconductor substrate of the first conductivity type and the first semiconductor layer of the first conductivity type. As a result, hole density of the interface of the semiconductor substrate of the first conductivity type and the first semiconductor layer of the first conductivity type is reduced, enabling the growth of crystal defect suppressed. Therefore, the silicon carbide semiconductor device according to the present invention enables current to flow in the built-in diode and use in an inverter in which fly back current flows in the built-in diode.

Further, when the first semiconductor layer of the first conductivity type is formed by epitaxial growth, lifetime accuracy is dependent on concentration and film thickness, and variation is great. On the other hand, in the present invention, proton irradiation is performed by ion implantation and therefore, control of the lifetime killer is good, enabling stable formation. Further, since proton irradiation is performed by ion implantation, fabrication at a lower cost than epitaxial growth is possible.

The silicon carbide semiconductor device and the method of manufacturing a silicon carbide semiconductor device according to the embodiments of the present invention achieve an effect in that expansion of stacking defects may be suppressed stably and at a low cost.

As described, the silicon carbide semiconductor device and the method of manufacturing a silicon carbide semiconductor device according to the embodiments of the present invention are useful for power supply devices such as various industrial machines and power equipment using an inverter circuit connected antiparallel to a diode in a silicon carbide MOSFET.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
    a semiconductor substrate of a first conductivity type;
    a first semiconductor layer of the first conductivity type provided on the semiconductor substrate, the first semiconductor layer having an impurity concentration that is lower than an impurity concentration of the semiconductor substrate;
    a second semiconductor layer of a second conductivity type provided on a first side of the first semiconductor layer, opposite a second side of the first semiconductor layer facing toward the semiconductor substrate;
    a first semiconductor region of the first conductivity type selectively provided in a surface layer of the second semiconductor layer, the first semiconductor region having an impurity concentration that is higher than the impurity concentration of the semiconductor substrate, the surface layer being on a first side of the second semiconductor layer, opposite a second side of the second semiconductor layer facing toward the first semiconductor layer;
    a gate electrode provided opposing at least a part of a surface of the second semiconductor layer between the first semiconductor region and the first semiconductor layer, across a gate insulating film; and
    a first electrode provided on the surface of the second semiconductor layer and the first semiconductor region, wherein
    protons are implanted in a first region of the semiconductor substrate, the first region spanning at least 2 μm from a surface of the semiconductor substrate facing toward the first semiconductor layer and in a second region of the first semiconductor layer, the second region spanning at least 3 μm from a surface of the first semiconductor layer on the second side of the first semiconductor layer facing toward the semiconductor substrate,
    the protons are implanted in the first region with a concentration in a range from $1\times10^{13}/cm^3$ to $1\times10^{15}/cm^3$,
    the protons are implanted in the second region with a concentration in a range from $1\times10^{13}/cm^3$ to $1\times10^{15}/cm^3$, and
    the first region corresponds to a portion of the semiconductor substrate, and protons are not implanted in another portion of the semiconductor substrate.

2. The silicon carbide semiconductor device according to claim 1, wherein
    the protons are implanted in a region of the first semiconductor layer other than the second region at a concentration of less than $1\times10^{13}/cm^3$.

3. The silicon carbide semiconductor device according to claim 1, wherein
    the protons are implanted in the gate insulating film.

4. The silicon carbide semiconductor device according to claim 1, wherein
    helium is implanted in place of the protons.

5. The silicon carbide semiconductor device according to claim 1, wherein
    the protons are not implanted in the gate insulating film.

6. A method of manufacturing a silicon carbide semiconductor device, the method comprising:
    forming a first semiconductor layer of a first conductivity type on a semiconductor substrate of the first conductivity type, the first semiconductor layer having an impurity concentration lower than an impurity concentration of the semiconductor substrate;

forming a second semiconductor layer of a second conductivity type on a first side of the first semiconductor layer, opposite a second side of the first semiconductor layer facing toward the semiconductor substrate;

selectively forming a first semiconductor region of the first conductivity type in a surface layer of the second semiconductor layer on a first side of the second semiconductor layer, opposite a second side of the second semiconductor layer facing toward the first semiconductor layer, the first semiconductor region having an impurity concentration higher than an impurity concentration of the semiconductor substrate;

forming a gate electrode opposing at least a part of a surface of the second semiconductor layer between the first semiconductor region and the first semiconductor layer, across a gate insulating film;

irradiating protons in a first region of the semiconductor substrate, the first region spanning at least 2 µm from a surface of the semiconductor substrate facing toward the first semiconductor layer, the protons irradiated and implanted in the first region having a concentration in a range from $1\times10^{13}/cm^3$ to $1\times10^{15}/cm^3$, irradiating protons in a second region of the first semiconductor layer, the second region spanning at least 3 µm from a surface of the first semiconductor layer on the second side of the first semiconductor layer facing toward the semiconductor substrate, the protons irradiated and implanted in the second region having a concentration of-the protons being in a range from $1\times10^{13}/cm^3$ to $1\times10^{15}/cm^3$; and forming a first electrode on surfaces of the first semiconductor region and the second semiconductor layer, wherein the first region corresponds to a portion of the semiconductor substrate, and protons are not implanted in another portion of the semiconductor substrate.

7. The method according to claim 6, wherein irradiating the protons includes irradiating the protons from a side of the semiconductor substrate facing toward the first electrode, and the method further includes performing heat treatment at a temperature of 420 degrees C. or less after forming the first electrode.

8. The method according to claim 6, wherein irradiating the protons includes irradiating the protons from a first side of the semiconductor substrate, opposite a second side of the semiconductor substrate facing toward the first electrode, and the method further includes performing heat treatment at a temperature of 420 degrees C. or less after forming the first electrode.

* * * * *

UNITED STATES PATENT AND TRADEMARK OFFICE
CERTIFICATE OF CORRECTION

PATENT NO. : 11,038,020 B2
APPLICATION NO. : 16/139714
DATED : June 15, 2021
INVENTOR(S) : Takumi Fujimoto Page 1 of 1

It is certified that error appears in the above-identified patent and that said Letters Patent is hereby corrected as shown below:

In the Claims

Column 20, Line 4:
In Claim 6, after "concentration" delete "of-the protons being"

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*